United States Patent
Lee et al.

(10) Patent No.: US 7,446,359 B2
(45) Date of Patent: Nov. 4, 2008

(54) IMAGE SENSOR INTEGRATED CIRCUIT DEVICES INCLUDING A PHOTO ABSORPTION LAYER

(75) Inventors: Jun Taek Lee, Gyeonggi-do (KR); Woon Phil Yang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 437 days.

(21) Appl. No.: 11/063,025

(22) Filed: Feb. 22, 2005

(65) Prior Publication Data

US 2005/0285215 A1   Dec. 29, 2005

(30) Foreign Application Priority Data

Jun. 28, 2004   (KR) ................ 10-2004-0048919

(51) Int. Cl.
H01L 31/062   (2006.01)
H01L 31/113   (2006.01)

(52) U.S. Cl. ............... 257/294; 257/291; 257/292
(58) Field of Classification Search ........... 257/292, 257/291, 294
See application file for complete search history.

(56) References Cited

U.S. PATENT DOCUMENTS

| | | | |
|---|---|---|---|
| 6,504,188 B1 * | 1/2003 | Maruyama et al. | 257/222 |
| 6,635,911 B2 * | 10/2003 | Maruyama | 257/291 |
| 6,781,210 B2 * | 8/2004 | Sugimoto et al. | 257/435 |
| 6,861,686 B2 * | 3/2005 | Lee et al. | 257/291 |
| 7,053,427 B2 * | 5/2006 | Tanigawa et al. | 257/294 |
| 7,193,289 B2 * | 3/2007 | Adkisson et al. | 257/431 |
| 7,196,365 B2 * | 3/2007 | Yamamura | 257/292 |
| 2001/0042875 A1 * | 11/2001 | Yoshida | 257/291 |
| 2004/0251395 A1 * | 12/2004 | Takahashi et al. | 250/208.1 |

FOREIGN PATENT DOCUMENTS

| | | |
|---|---|---|
| JP | 06-260628 A | 9/1994 |
| JP | 8306895 | 11/1996 |
| JP | 11-214664 A | 8/1999 |

(Continued)

OTHER PUBLICATIONS

Notice of Allowance for Korean Patent application 9-5-2007-032320968; Jun. 13, 2007.

(Continued)

*Primary Examiner*—Shouxiang Hu
(74) *Attorney, Agent, or Firm*—Myers Bigel Sibley & Sajovec

(57) ABSTRACT

Integrated circuit devices include a semiconductor substrate and a sensor array region including a plurality of photoelectric conversion elements arranged in an array on the semiconductor substrate. A plurality of interlayer dielectric layers are on the sensor array region and a plurality of light transmissive regions extend through the plurality of interlayer dielectric layers from respective ones of the plurality of photoelectric conversion elements. A plurality of light reflecting metal elements are between ones of the plurality of interlayer dielectric layers, positioned outside of and between ones of the light transmissive regions. A photo absorption layer is formed on an upper surface of ones of the plurality of metal elements that inhibits reflection of light associated with the photoelectric conversion element of one of the light transmissive regions to another of the light-transmissive regions to limit crosstalk between the plurality of photoelectric conversion elements.

17 Claims, 21 Drawing Sheets

FOREIGN PATENT DOCUMENTS

| | | |
|---|---|---|
| KR | 10-1997-0007401 | 2/1997 |
| KR | 1020000006427 A | 1/2000 |
| KR | 1020000041459 | 7/2000 |
| KR | 10-2001-0005046 | 1/2001 |
| KR | 1020040007970 | 1/2004 |

OTHER PUBLICATIONS

Translation of Korean Office Action for 10-2004-0048919 mailed Aug. 4, 2006.

Korean Office Action for corresponding application 10-2004-0048919 issued Aug. 4, 2006.

* cited by examiner

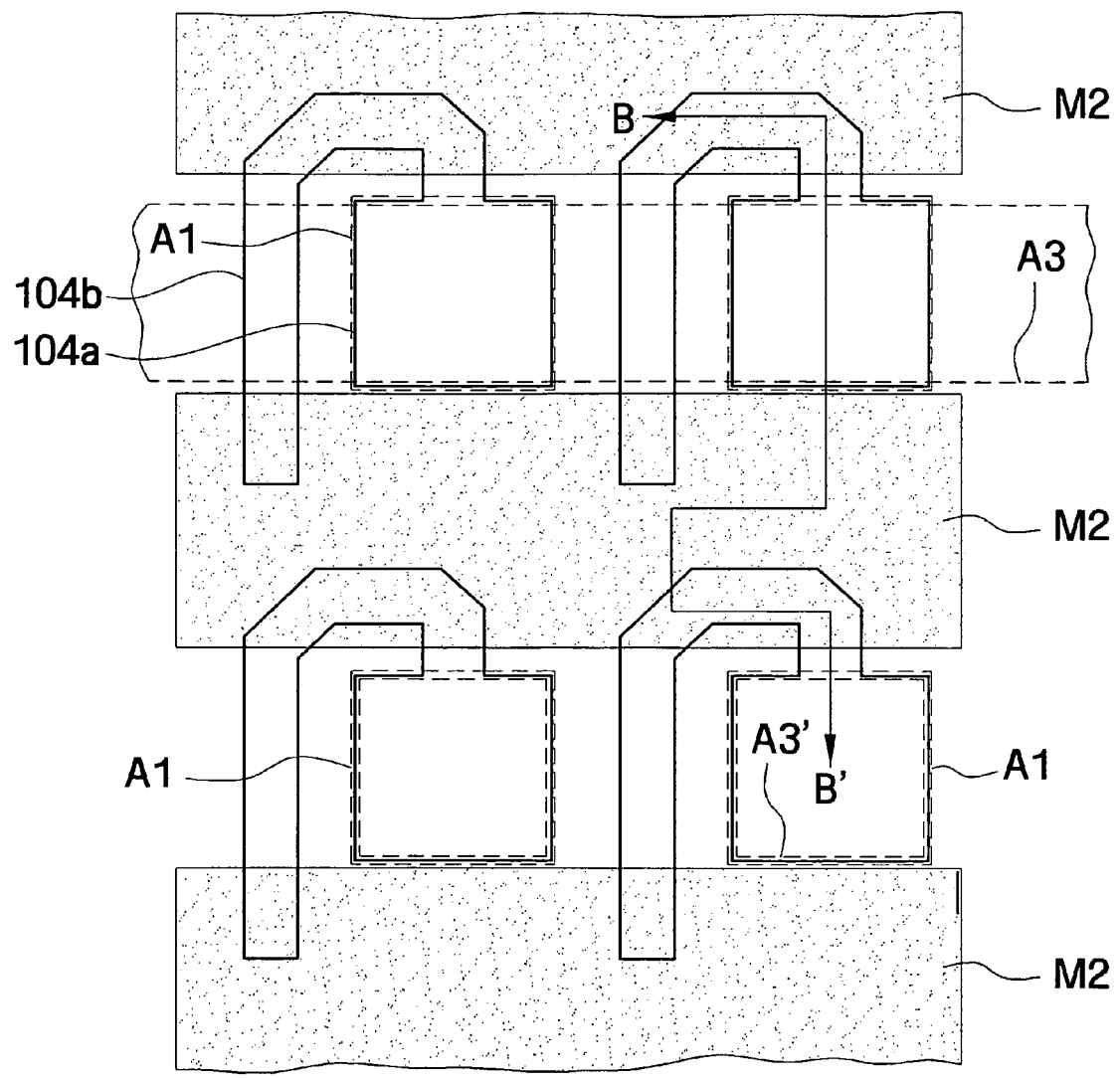

US 7,446,359 B2

IMAGE SENSOR INTEGRATED CIRCUIT DEVICES INCLUDING A PHOTO ABSORPTION LAYER

CROSS-REFERENCE TO RELATED APPLICATION

This application is related to and claims priority from Korean Patent Application No. 2004-48919, filed on Jun. 28, 2004, the disclosure of which is hereby incorporated herein by reference in its entirety.

BACKGROUND OF THE INVENTION

The present invention relates to integrated circuit devices and, more particularly, to image sensor integrated circuit devices and methods of forming the same.

Digital image capture functionality is now provided in a variety of different devices, including a wide range of digital cameras, cellular phones and the like. Such digital image capturing devices typically include an image sensor array capturing image data by "pixel," with the resolution of the image sensor being defined by its number of pixels. A captured image from the image sensor array is generally represented by digital data, which may be displayed, transmitted to another device, subject to image processing, such as image recognition and the like. Two commonly used technologies for an image sensor include a charge coupled device (CCD) and a CMOS image sensor (CIS).

A typical CCD 10 is illustrated in the block diagram of FIG. 1. As illustrated in FIG. 1, the CCD 10 includes a plurality of photodetectors 11. Each vertical column 13 of photodetectors 11 is coupled to a vertical CCD shift register 15. The vertical CCD shift registers 15 are coupled to a horizontal CCD shift register 17. The horizontal CCD shift register 17 is coupled to an amplifier 19 that outputs an amplified image signal. CCD type sensors are typically used in a variety of applications, including high quality digital cameras, as they generally provide a high quality image signal with low noise and high uniformity as there is generally no amplification of the sensed signal provided at the individual photodetector (pixel) 11 level. However, CCD sensors are generally difficult to integrate with other camera functions on a single integrated circuit device (chip). They also generally have high power consumption and a slow frame read rate.

A typical CIS configuration is illustrated in the block diagram of FIG. 2. As illustrated in FIG. 2, the CIS 20 includes a sensor array 21 including a plurality of photodetector circuits (active pixels) 23. Each photodetector circuit 23 includes a photodetector and its associated access circuitry as will be described with reference to FIG. 3. The photodetector circuits 23 are arranged in an array of cells, with a cell being selected for reading by the row decoder 25 and the column decoder 26. The photodetector circuits 23 are read with amplification by the column amplifiers 27 and further amplification by the output amplifier 29. A photodetector signal, therefore, may be subjected to amplification by the photodetector circuit 23 and further amplified by the column amplifiers 27 and the output amplifier 29. These multiple levels of amplification may result in high noise and greater non-uniformity than a CCD device. However, a CIS is generally easier to integrate with other camera functions on a single integrated circuit device, generally operates with lower power consumption and may provide a higher frame rate.

FIG. 3 is a circuit diagram illustrating a conventional configuration for a CIS photodetector circuit 30. As shown in FIG. 3, a photoelectric conversion element 31 captures incident light and converts the incident light to a stored charge. A transfer transistor 31A passes the stored charge from the photoelectric conversion element 31 to a floating diffusion region 32. A reset transistor 33 resets charge accumulated in the floating diffusion region 32 to a reference level. Amplification at the pixel level is provided by a drive transistor 34, which is illustrated as a source follower amplifier that buffers a voltage output $V_{OUT}$ to an output line (Out) 35. A select transistor 36 selectively couples a selected photodetector circuit 30 to the output line 35. As shown in the illustration of FIG. 3, drains of the reset transistor 33 and the driver transistor 34 are connected to a source voltage $V_{DD}$. The gate of the select transistor 36 is connected to a control signal (Row SEL) 37. The source of the select transistor 36 is connected to the output line 35. The gates of the transfer transistor 31A and the reset transistor 33 are connected to respective control signal lines Tx 38 and Rx 39. The relationship between the control signal lines Row SEL 37, Rx 39, Tx 38 and the output line 35 of FIG. 3 for a plurality of photodetector circuits 30 arranged in an active pixel sensor array 40 are illustrated in FIG. 4.

FIG. 5 is a cross-sectional view illustrating a portion of an integrated circuit photodetector circuit 50 for a photoelectric conversion element 51. As shown in FIG. 5, a photoelectric conversion element 51 is provided in a semiconductor substrate 53. It will be understood that FIG. 5 merely provides a simplified depiction of the photoelectric conversion element 51 for purposes of illustration of operation thereof. A plurality of interlayer dielectric layers 55, 55', 55" and metal layers M1, M2, M3 are also shown in FIG. 5.

Also shown in FIG. 5 are a variety of incident light rays, R1, R2, R3 passing through a light transmissive region 59 associated with the photoelectric conversion element 51 that is defined by an opening aperture A1 and extends through the interlayer dielectric layers 55, 55', 55" to allow incident light to be received by the photoelectric conversion element 51. Generally, to provide a best resolution image, it is desirable with a sensor array, such as an active pixel sensor array, that light passing through an aperture A1 be incident only on the corresponding associated photoelectric conversion element 51. However, as illustrated by the various rays R1, R2, R3 in FIG. 5, degradation may be caused by various incident light rays passing through the aperture A1 and striking adjacent photoelectric conversion elements. Refracted rays R1 may be generated as a result of the respective interlayer dielectric layers 55, 55', 55" having different indices of refraction. The reflected rays R2 may be generated by reflection from the upper surface and/or side surface of a metal layer M1, M2, M3. Finally, defracted rays R3 may be generated because of the displacement distance between the top metal layer M3, including the aperture A1, and the photoelectric conversion element 51 having a greater length than the wavelength of an incident light ray. The refracted, reflected and/or defracted rays R1, R2, R3 may shine on neighboring photoelectric conversion elements that are not intended to receive this incident light, which may induce cross talk with an adjacent pixel photoelectric conversion element.

SUMMARY OF THE INVENTION

Embodiments of the present invention include integrated circuit devices having a semiconductor substrate and a sensor array region including a plurality of photoelectric conversion elements arranged in an array on the semiconductor substrate. A plurality of interlayer dielectric layers are on the sensor array region and a plurality of light transmissive regions extend through the plurality of interlayer dielectric layers from respective ones of the plurality of photoelectric conversion elements. A plurality of light reflecting metal elements are between ones of the plurality of interlayer dielectric layers, positioned outside of and between ones of the light transmissive regions. A photo absorption layer is formed on an upper surface of ones of the plurality of metal elements that inhibits reflection of light associated with the photoelectric conversion element of one of the light transmissive regions to another of the light transmissive regions to limit crosstalk between the plurality of photoelectric conversion elements.

In other embodiments of the present invention, the photo absorption layer is formed on the upper surface and sides of the ones of the plurality of metal elements. The photo absorption layer may be tungsten, titanium, tungsten nitride, titanium nitride and/or silicon nitride. The integrated circuit device may be a CMOS image sensor (CIS).

In further embodiments of the present invention, the plurality of interlayer dielectric layers includes a first interlayer dielectric layer on the sensor array region and a second interlayer dielectric layer on the first interlayer dielectric layer. The plurality of light reflecting metal elements includes a first metal layer on the first interlayer dielectric layer and that has portions extending between ones of the light transmissive regions and a second metal layer on the second interlayer dielectric layer and having portions extending between ones of the light transmissive regions. The photo absorption layer may be on the second metal layer or may be on the first metal layer and the second metal layer. A plurality of trenches may be provided in the second interlayer dielectric layer, ones of the trenches being positioned in and associated with respective ones of the light transmissive regions and the photo absorption layer may extend along sidewalls of the trenches.

In some embodiments of the present invention, the photo absorption layer extends along a portion of a bottom of the trenches to define apertures associated with the respective photoelectric conversion elements. The apertures may have a size no greater than a light receiving size of the photoelectric conversion elements. The apertures may be longitudinally extending apertures, each of which is associated with a plurality of photoelectric conversion elements in a row or column of the array of photoelectric conversion elements.

In yet other embodiments of the present invention, the second interlayer dielectric layer includes a lower layer, an etch stop layer on the lower layer and an upper layer on the etch stop layer and the trenches extend through the upper layer to the etch stop layer. Alternatively, the trenches may extend through the second interlayer dielectric layer and into the first interlayer dielectric layer. The first interlayer dielectric layer may include a lower layer, an etch stop layer on the lower layer and an upper layer on the etch stop layer and the trenches may extend through the upper layer to the etch stop layer of the first interlayer dielectric layer. The trenches may have sloped sidewalls. The photo absorption layer may extend along sidewalls of the second metal layer. The photo absorption layer may extend from the sidewalls of the second metal layer along a surface of the second interlayer dielectric layer to define apertures associated with the respective photoelectric conversion elements.

In some embodiments of the present invention, the photo absorption layer is on the first metal layer. A plurality of trenches may be provided in the first interlayer dielectric layer, ones of the trenches being positioned in and associated with respective ones of the light transmissive regions, and the photo absorption layer may extend along sidewalls of the trenches. The photo absorption layer may extend along a portion of a bottom of the trenches to define apertures associated with the respective photoelectric conversion elements. The apertures may have a size no greater than a light receiving size of the photoelectric conversion elements. The first interlayer dielectric layer may include a lower layer, an etch stop layer on the lower layer and an upper layer on the etch stop layer and the trenches may extend through the upper layer to the etch stop layer. The photo absorption layer may extend along sidewalls of the first metal layer and may extend from the sidewalls of the first metal layer along a surface of the first interlayer dielectric layer to define apertures associated with the respective photoelectric conversion elements. The first metal layer may have a thickness of less than about 1000 Angstroms (Å).

In other embodiments of the present invention, the plurality of interlayer dielectric layers further includes a third interlayer dielectric layer on the first interlayer dielectric layer and the plurality of light reflecting metal elements further includes a third metal layer on the third interlayer dielectric layer and having portions extending between ones of the light transmissive regions. The photo absorption layer may be on the third metal layer. A plurality of trenches may be provided in the first, second and third interlayer dielectric layers, ones of the trenches being positioned in and associated with respective ones of the light transmissive regions, and the photo absorption layer may extend along sidewalls of the trenches. The first interlayer dielectric layer may include a lower layer, an etch stop layer on the lower layer and an upper layer on the etch stop layer and the trenches may extend through the upper layer to the etch stop layer.

In some other embodiments of the present invention, for each photoelectric conversion element, a floating diffusion region is provided in the semiconductor substrate configured to accumulate charge received from the photoelectric conversion element and a conductive contact extends through the first interlayer dielectric layer from the floating diffusion region to the first metal layer. For each photoelectric conversion element, a drive transistor configured to amplify a voltage of the floating diffusion region may be provided and the first metal layer may extend between the contact and the drive transistor.

In yet other embodiments of the present invention, the photo absorbing layer is a material having a light absorption rate greater than oxide materials and a light reflection rate lower than a light reflection rate of the plurality of light reflecting metal elements. The plurality of photoelectric conversion elements may be an active pixel sensor array and the integrated circuit device may further include a timing generator on the semiconductor substrate coupled to the active pixel sensor array. The integrated circuit device may further include an analog to digital converter circuit on the semiconductor substrate coupled to the active pixel sensor array.

In some embodiments of the present invention, an integrated circuit device includes a semiconductor substrate and a sensor array region including a plurality of photoelectric conversion elements arranged in an array on the semiconductor substrate. An interlayer dielectric layer is on the sensor array region and a plurality of light transmissive regions extend through the interlayer dielectric layer from respective ones of the plurality of photoelectric conversion elements. A plurality of light reflecting metal elements on the interlayer dielectric layer are positioned outside of and between ones of the light transmissive regions and a photo absorption layer is formed on an upper surface of ones of the plurality of metal elements that inhibits reflection of light directed to one of the light transmissive regions to another of the light transmissive regions.

In other embodiments of the present invention, methods of forming an integrated circuit device include forming a plurality of photoelectric conversion elements arranged in a sensor array region of the semiconductor substrate. A first interlayer dielectric layer is formed on the sensor array region and a first metal layer is formed on the first interlayer dielectric layer. The first metal layer has openings therein over the plurality of photoelectric conversion elements. A second interlayer dielectric layer is formed on the first metal layer and extends over the sensor array region and a second metal layer is formed on the second interlayer dielectric layer. The second metal layer has openings therein over the plurality of photoelectric conversion elements. A photo absorption layer is formed on an upper surface of the second metal layer that inhibits reflection of light received in a portion of the sensor array region associated with one of the photoelectric conversion elements to another of the photoelectric conversion elements to limit crosstalk between the plurality of photoelectric conversion elements.

In further embodiments of the present invention, forming a second metal layer and forming a photo absorption layer include forming the second metal layer on the second interlayer dielectric layer, forming the photo absorption layer on the second metal layer; and then patterning the second metal layer and the photo absorption layer to define the openings in the second metal layer over the plurality of photoelectric conversion elements. In other embodiments, forming a second metal layer and forming a photo absorption layer include forming the second metal layer on the second interlayer dielectric layer, patterning the second metal layer to define the openings in the second metal layer over the plurality of photoelectric conversion elements, forming the photo absorption layer on the patterned second metal layer, and patterning the photo absorption layer to define apertures associated with the plurality of photoelectric conversion elements.

In yet other embodiments of the present invention, methods of forming an integrated circuit device include forming a plurality of photoelectric conversion elements arranged in a sensor array region of the semiconductor substrate. An interlayer dielectric layer is formed on the sensor array region and a metal layer is formed on the first interlayer dielectric layer. The metal layer has openings therein over the plurality of photoelectric conversion elements. A photo absorption layer is formed on an upper surface the metal layer that inhibits reflection of light received in a portion of the sensor array region associated with one of the photoelectric conversion elements to another of the photoelectric conversion elements to limit crosstalk between the plurality of photoelectric conversion elements.

BRIEF DESCRIPTION OF THE DRAWINGS

The present invention will now be described with reference exemplary embodiments illustrated in the attached drawings in which:

FIG. 8B is a top planar view of the image sensor of FIG. 8A.

DETAILED DESCRIPTION OF THE INVENTION

Figure 1:
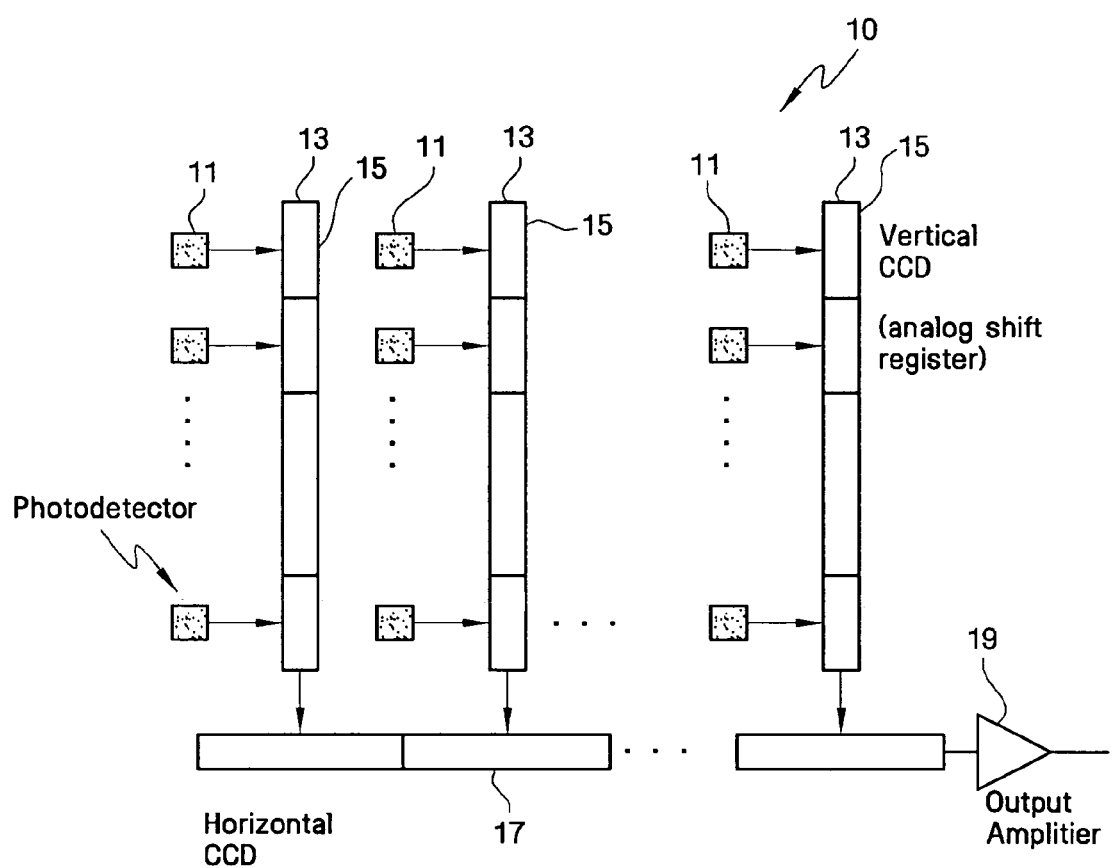
FIG. 1 is a block diagram illustrating a charge coupled device (CCD) image sensor according to the prior art.
Figure 2:
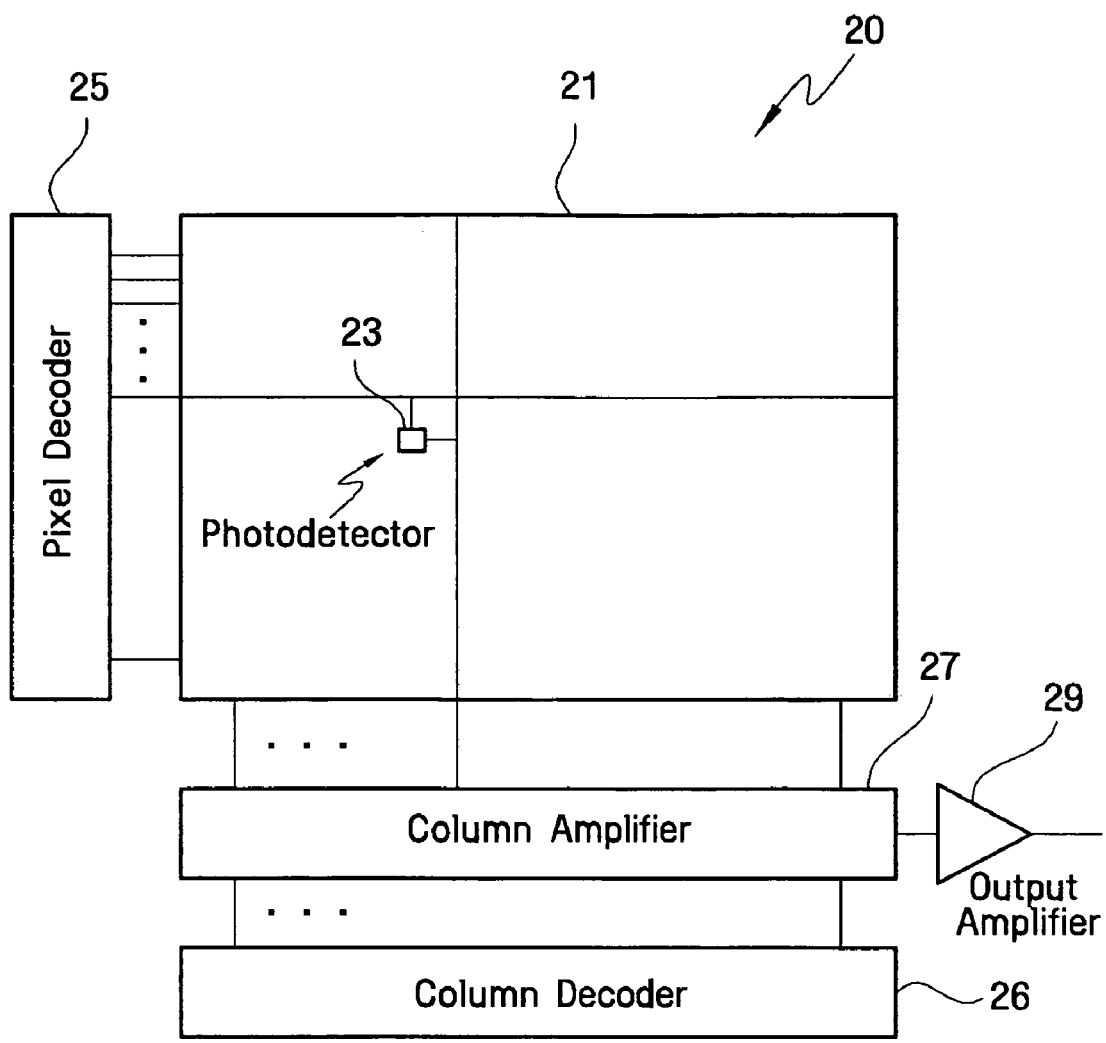
FIG. 2 is a block diagram illustrating a CMOS image sensor (CIS) according to the prior art.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
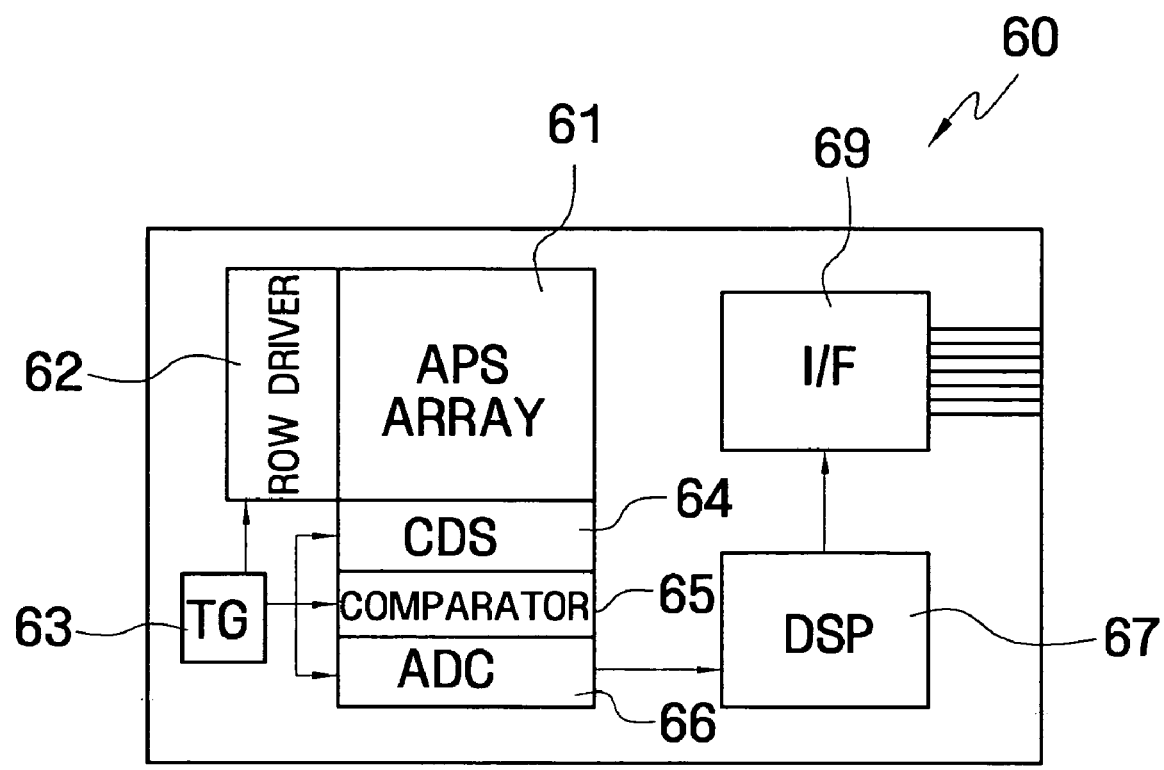
FIG. 6 is a block diagram illustrating an image sensor according to some embodiments of the present invention.

Various embodiments of the present invention will now be described with reference to FIGS. 6 through 12C. FIG. 6 is a block diagram illustrating a CIS 60 that may include photoelectric conversion elements in accordance with embodiments of the present invention. As shown in FIG. 6, the photoelectric conversion elements according to some embodiments of the present invention are arranged in a two dimensional array in an active pixel sensor (APS) array 61. A row of pixels of the APS array 61 may be selected by a row driver 62. A timing generator 63 generates a timing signal used for reading the APS array 61. In the embodiments of FIG. 6, the columns of pixels are connected to a correlated double sampler (CDS) 64 that corrects double sampling of an output voltage signal from a pixel of each column that is selected by the row driver 62. The CDS 64 provides the voltage output for a selected pixel of each row to a comparator 65 that compares the voltage output signals to a reference signal. An analog to digital converter (ADC) 66 converts analog signals from the comparator 65 to a digital signal. The digital signal from the ADC 66 may be further processed to improve the signal by a digital signal processor (DSP) 67 to provide a digital image signal to interface (I/F) circuit 69, which may transmit the signal to another device and/or receive command signals from another device. It will be understood that, while the CIS 60 of FIG. 6 will generally be described herein as a single integrated circuit device, the invention is not limited to such a configuration as various of the described circuits, such as the DSP 67, may be on a separate integrated circuit device(s) from the APS array 61.

Figure 7A:
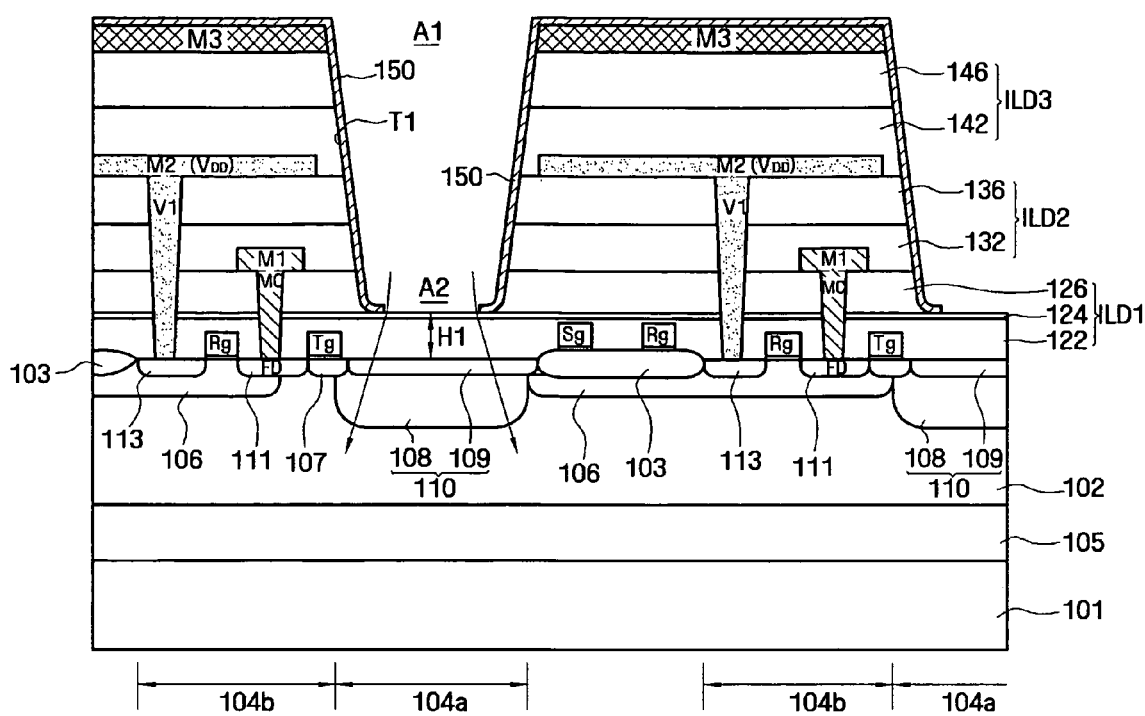
FIG. 7A is a cross-sectional diagram illustrating an image sensor according to some embodiments of the present invention.

Embodiments of a photoconversion element used for a pixel for an integrated circuit image sensor device according to the present invention will now be described with reference to FIGS. 7A and 7B. It will be understood that various of the features shown in the cross sectional view of 7A generally correspond to an integrated circuit device implementation of the circuit described above with reference to FIG. 3. The embodiments illustrated in FIG. 7A include a substrate 101 having an epitaxial region 102 and a deep p-well 105. Also shown is an isolation region 103 between adjacent photoelectric conversion elements 110 and a p-well 106. Region 107 corresponds to a channel region of a transfer transistor (transfer transistor 31A of FIG. 3) with a transfer gate Tg thereon. The photo diode photoelectric conversion element 110 illustrated in FIG. 7A includes an n-type region 108 and a p-type hole accumulation diode (HAD) region 109. A floating diffusion region (FD) 111 is also shown adjacent the channel region 107 of the transfer transistor. Floating diffusion region 111 corresponds to the floating diffusion region 32 of FIG. 3. Also shown in the cross sectional illustration of FIG. 7A is a drain region 113 of a reset transistor (shown as reset transistor 33 in FIG. 3). Additional gate electrodes Rg, Sg are also shown in FIG. 7A associated with the receive transistor 33 and the select transistor 36 of FIG. 3.

Figure 3:
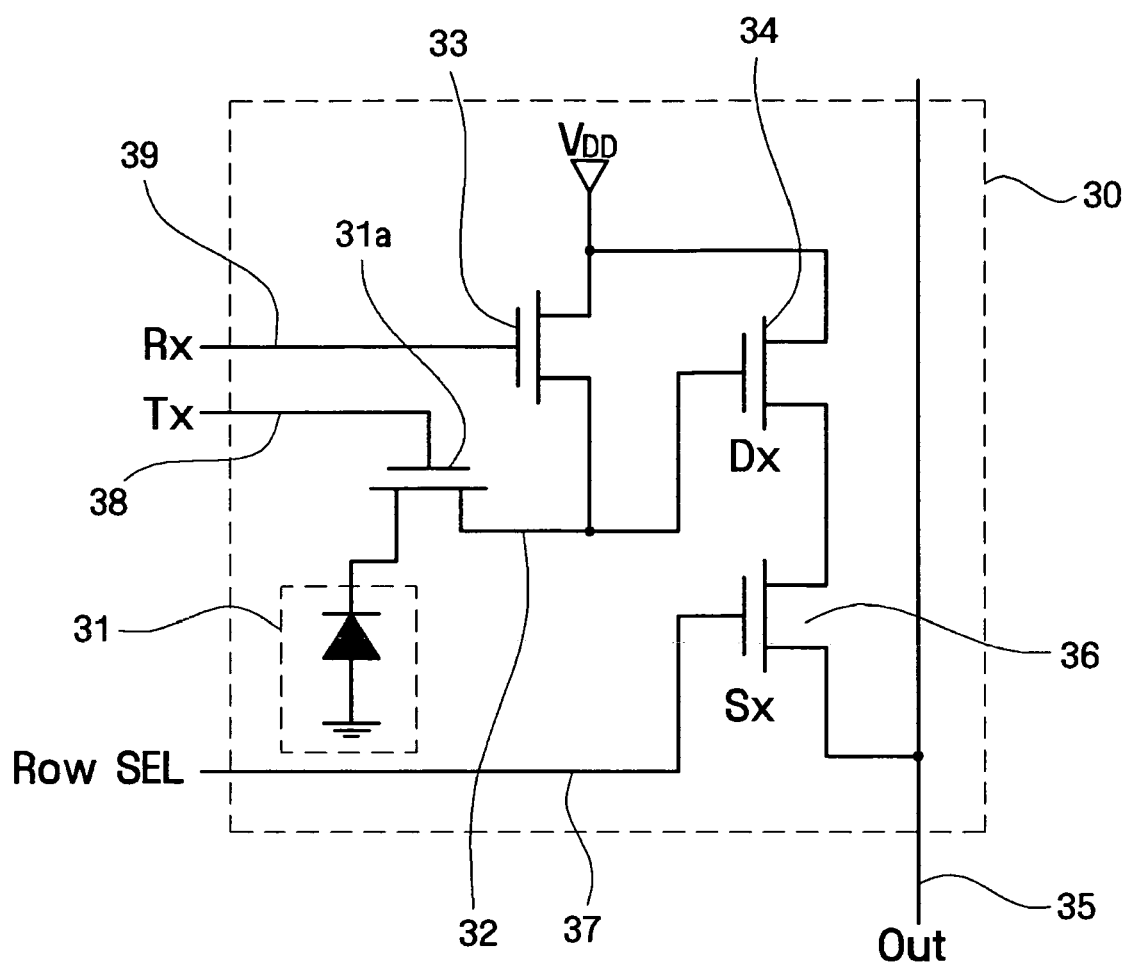
FIG. 3 is a circuit diagram illustrating a pixel cell of a CIS according to the prior art.
Figure 4:
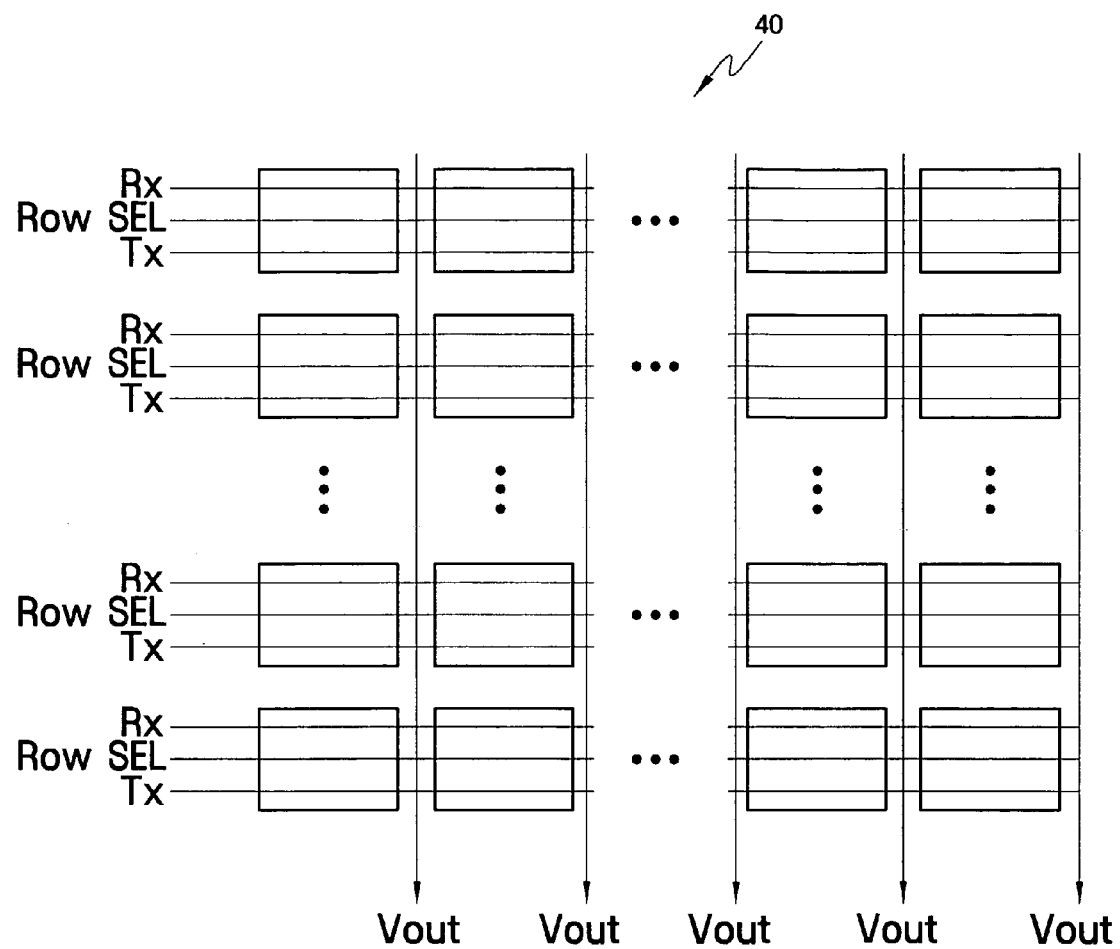
FIG. 4 is a block diagram illustrating an active pixel sensor array (APS) according to the prior art.
Figure 5:
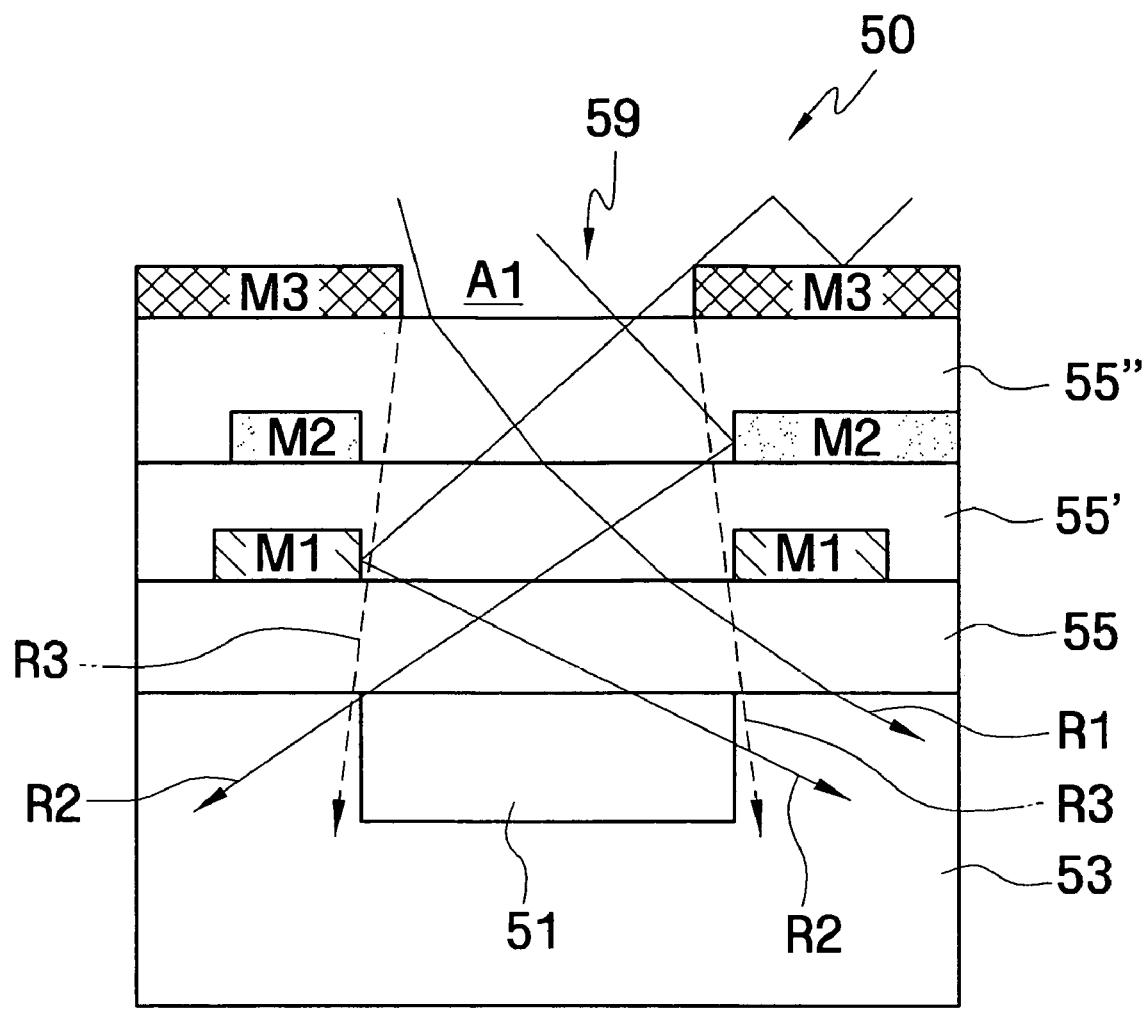
FIG. 5 is a cross-sectional view illustrating a pixel cell of a CIS according to the prior art.

FIG. 7A further illustrates a first inner layer dielectric layer ILD1 with a first metal layer MI thereon, a second inter layer dielectric layer ILD2, with a second metal layer M2 thereon and a third interlayer dielectric layer ILD3 with a third metal layer M3 thereon. The first interlayer dielectric layer ILD1 is illustrated as including three layers 122, 124, 126, one of which may be an etch stop layer 124. The second interlayer dielectric layer ILD2 is shown as including two layers 132, 138 and the third interlayer dielectric layer ILD3 is also shown as including two layers 142, 146. In the embodiments illustrated in FIG. 7A, the first metal layer M1 provides electrical conduction paths for electronically connecting the floating diffusion region 111 with a gate of the drive transistor 34 (FIG. 3). The metal layer M1 is defined outside of the light transmissive regions extending from the photoelectric conversion element 110 through the aperture A1 in the photoelectric conversion element region 104a. More particularly, the metal layer M1 is formed in an active device region 104b between adjacent photoelectric conversion elements 110 and their respective light transmission regions. A metal contact MC is formed from the floating diffusion region 111 to the metal layer M1 through the first interlayer dielectric region ILD1.

The second metal layer M2, in the embodiments of FIG. 7A, is formed to supply power VDD to the drain region 113 of a reset transistor (transistor 33 of FIG. 3) formed beside the photoelectric conversion element region 104a in the region 104b. A via V1 is formed through the first interlayer dielectric region ILD1 and the second interlayer dielectric region ILD2 to connect the second metal layer M2 with the drain region 113. Also shown in the embodiments of FIG. 7A is a third metal layer M3 formed to shield light so that the light may pass through respective light transmissive regions for the corresponding photoelectric conversion elements 110. The third metal layer M3 is shown as formed on the third interlayer dielectric layer ILD3. It will be understood that metal layers M1 and M2 likewise would provide a shield should light be incident thereon. The metal layer M3 includes the respective corresponding apertures A1 above the respective photoelectric conversion elements 110 and define an opening to the respective corresponding light transmissive regions. In some embodiments of the present invention, the size of the aperture A1 cross section is selected to be the same as or larger than that of its respective photoelectric conversion element 110.

A trench T1 is formed above the respective photoelectric conversion elements 110 extending through the interlayer dielectric layers ILD1, ILD2, ILD3 for the embodiments illustrated in FIG. 7A. As shown in FIG. 7A, the bottom of the trench T1 is below the lower metal layer M1 and displaced a selected distance H1 from the photoelectric conversion element 10. As such, the trench T1 may be isolated from the photoelectric conversion element 110, which may reduce the risk of damage to the photoelectric conversion element 110 during formation of the trench T1. Thus, H1 may be selected as a depth sufficient so that etch damage will not be expected to degrade a dark defect level characteristic of the photoelectric conversion element 110. In some embodiments of the present invention, the depth H1 is selected to be at least about 100 angstroms (Å).

Also shown in the embodiments of FIG. 7A is an etch stop layer 124 in the first interlayer dielectric layer ILD1 that may be used to control formation depth of the trench T1. However, in other embodiments of the present invention, an etch stop layer 124 is not utilized. A photo absorption layer 150 is formed on the surface, the sidewalls and, in some embodiments, the bottom of the trench T1 and is also shown in FIG. 7A as formed on an upper surface of the metal layer M3. Thus, the trench T1 defines a light transmissive region extending towards the photoelectric conversion element 110 from the aperture A1 to allow passage of light thereto.

In some embodiments of the present invention, the photo absorption layer 150 is one or more of tungsten, titanium, tungsten nitride, titanium nitride or silicon nitride. In other embodiments of the present invention, the photo absorption layer 150 is formed from the group consisting of tungsten, titanium nitride and silicon nitride. An aperture A2 is formed in the bottom of the trench T1 through the photo absorption layer 150 to define a light receiving aperture at the bottom of the trench T1. The cross sectional area of the aperture A2 may be selected, in some embodiments of the present invention, to be no larger than that of the photoelectric conversion element 110 to provide for tolerance of misalignment during formation of the aperture A2. Thus, the photo absorption layer 150 in the embodiments of FIG. 7A is formed at an upper surface of the metal layer M3 and side surfaces of the metal layer M3 and is formed of a material configured to inhibit reflection of light associated with the photoelectric conversion element 110 of one of the light transmissive regions defined by the trench T1 to another of the light transmissive regions for a different photoelectric conversion element 110 to limit cross talk between the array of photoelectric conversion elements 110. The formation of the photo absorption layer 150 along sidewalls of the trench T1 may further reduce light reflection off of the metal layers M2 and M1.

The trench T1, as illustrated in the embodiments of FIG. 7A, may have a sloped shape. Such a sloped shape may operate to concentrate light received in the aperture A1 towards the photoelectric conversion element 110 (i.e., as the photo absorption layer may be reflective). In addition, the sloped shape may facilitate the deposition of the photo absorption layer 150 during formation of the integrated circuit device image sensor array. Finally, it will be understood that, while the trench T1 defining the light transmissive region in FIG. 7A is illustrated as an open area, in various embodiments of the present invention, additional materials are deposited filling the trench T1, such filling materials being selected to be light transmissive so as to not interfere with operation with the photoelectric conversion element 110. Also, while particular metal layers related to specific circuit connections for the photo electric conversion element 110 are shown as the metal layers M1, M2, M3 covered by the photo absorption layer 150 in the embodiments of FIG. 7A, it will be understood that the present invention may be beneficially applied to reduce the potential for undesired reflection of light between adjacent photoelectric conversion elements for other light reflecting metal elements positioned between ones of the photoelectric conversion elements 110. It will further be understood that the various regions formed in the epitaxial region 102 may be conventional CIS device regions.

Figure 7B:
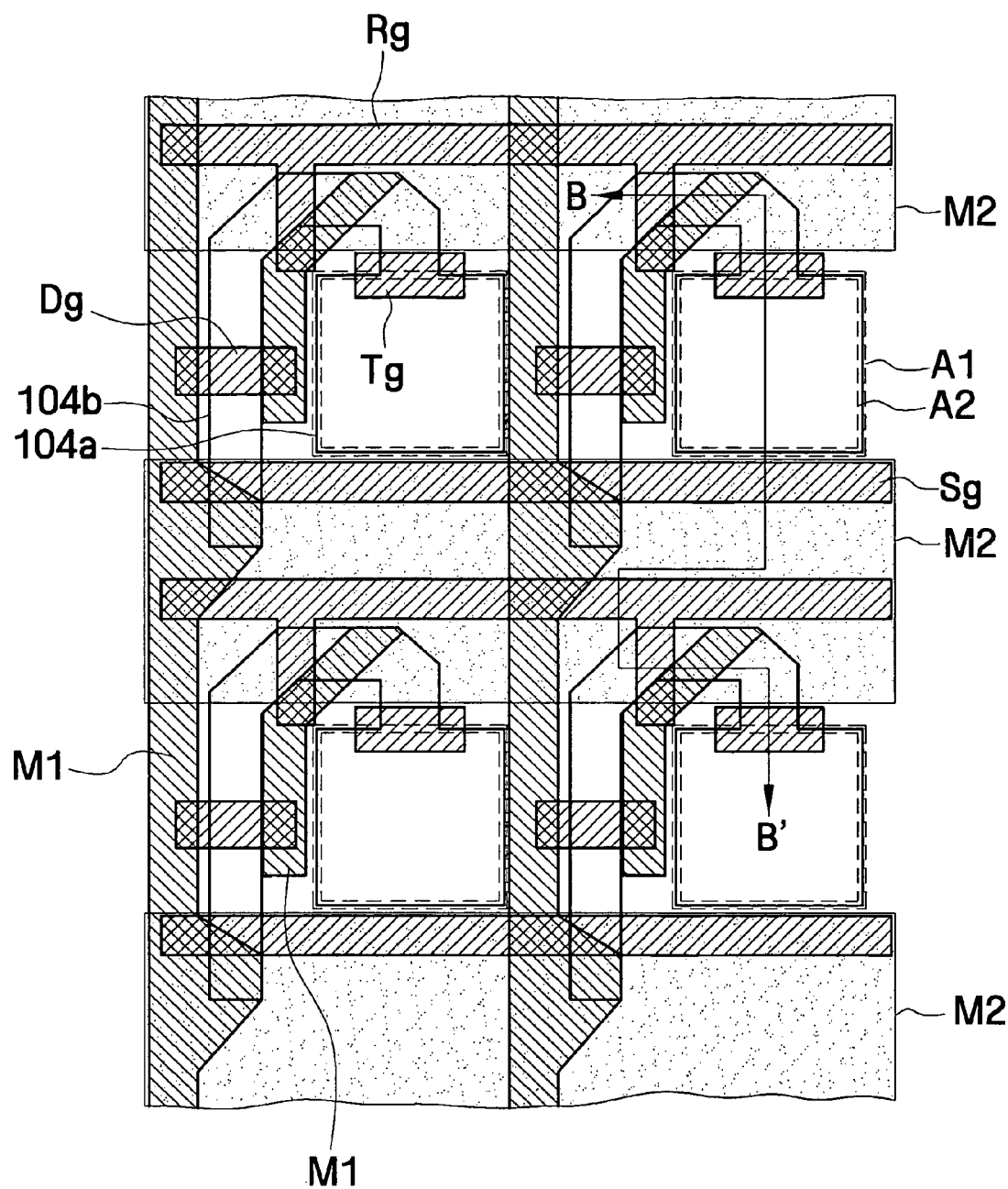
FIG. 7B is a top planar view of the image sensor of FIG. 7A.

Referring now to FIG. 7B, a top planer view is provided of the image sensor shown in the cross section view of FIG. 7A. In particular, the cross section of FIG. 7A corresponds to the line BB' shown in FIG. 7B. Also note that, in addition to the various structures discussed with respect to the cross section illustration of FIG. 7A, FIG. 7B illustrates a gate Dg of the drive transistor 34 illustrated in FIG. 3. To simplify understanding of the layout of the various structures in the planer view of FIG. 7B, the metal layer M3 is not shown in FIG. 7B nor is the photo absorption layer 150. However, the positioning of respective apertures A1, A2 is shown for each of four adjacent photoelectric conversion element pixel regions in FIG. 7B.

Further embodiments of the present invention will now be described with reference to the illustrations of FIG. 8A through FIG. 12C. It will be understood that various elements in each of these respective embodiments have been previously described with reference to FIGS. 7A and 7B and these like numbered elements will not be further described herein except as necessary to explain the various embodiments illustrated in these figures.

Figure 8A:
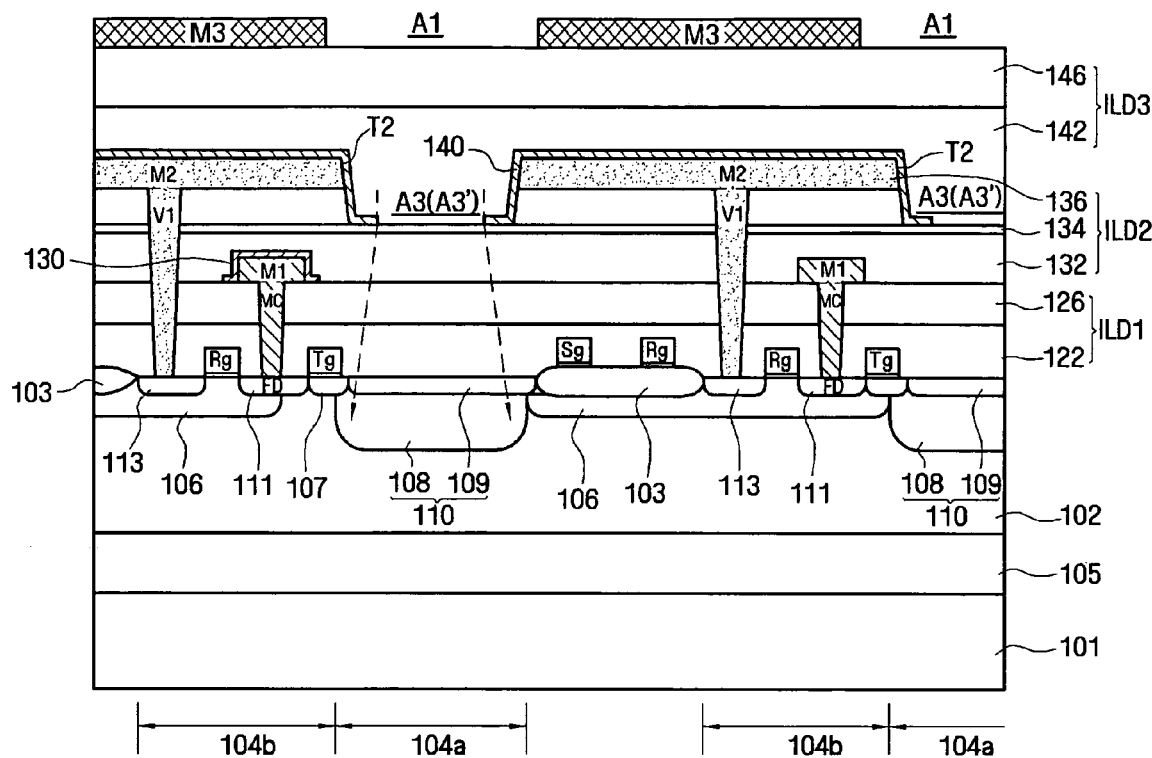
FIG. 8A is a cross-sectional diagram illustrating an image sensor according to some embodiments of the present invention.

As shown in the embodiments of FIG. 8A, a trench T2 is formed in the second interlayer dielectric layer ILD2. The third interlayer dielectric layer ILD3 extends into the trench T2. The embodiments illustrated in FIG. 8A further differ from those illustrated in FIG. 7A in the inclusion of an etch stop layer 134 in the interlayer dielectric layer ILD2 and the omission of the etch stop layer 124 from the first interlayer dielectric layer ILD1. The etch stop layer 134 may be included to facilitate forming the trench T2 to a desired depth in the interlayer dielectric layer ILD2. However, in other embodiments of the present invention, the etch stop layer 134 may be omitted and other means may be used to control the depth of the trench T2. Note that, for the embodiments of FIG. 8A and other of the embodiments to be described below, the third metal layer M3 on the third interlayer dielectric layer ILD3 and/or the second metal layer M2 may not be shown in the figures but may, nonetheless, be found in the integrated circuit devices of such embodiments.

Also shown for the embodiments of FIG. 8A is a photo absorption layer 140 formed on an upper surface of the second metal layer M2 and along the sidewalls and, in some embodiments, a bottom of the trench T2. An aperture A3 or A3' is formed in the photo absorption layer 140 over each of the photoelectric conversion elements 110. Two different approaches to forming the aperture A3 or A3' are best seen in the top planer view of FIG. 8B where it is seen that the aperture A3 runs parallel to the second metal layer M2 while the embodiments using the aperture A3' have a separate aperture window A3' over each photoelectric conversion element 110.

As with the photo absorption layer 150, the photo absorption layer 140 is configured to inhibit reflection of light associated with the photoelectric conversion elements 110 to other adjacent ones of the photoelectric conversion elements to limit cross talk between the photoelectric conversion elements 110. The photo absorption layer 140 may be tungsten, titanium, tungsten nitride, titanium nitride and/or silicon nitride.

The aperture A3, A3' defines a light receiving area through the photo absorption layer 140 at the bottom of the trench T2. In some embodiments of the present invention, the size of the aperture A3, A3' is the same as or smaller than that of the cross sectional area of the photoelectric conversion element 110 to compensate for misalignment during formation of the aperture A3, A3'. It will be understood that, for the embodiments having a longitudinally extending aperture A3, the width of the aperture A3 may be selected to be smaller than the corresponding width of the photoelectric conversion element 110. As shown in FIG. 8A, the photo absorption layer 140 covers the upper surface and side surface of the second metal layer M2 so as to decrease generation of reflective rays that may cause cross talk to other adjacent photoelectric conversion elements 110.

As shown in FIG. 8A, in some embodiments of the present invention, a further photo absorption layer 130 is formed on an upper surface of the first metal layer M1. Such additional photo absorption layer 130 may prevent or limit reflection from the first metal layer 130 of incident rays of light entering through the light transmissive region for a particular photoelectric conversion element 110 that are not blocked by the photoabsorption layer 140 from being reflected to and received by an adjacent photoelectric conversion element 110. As further shown in the embodiments of FIG. 8A, the trench T2 is filled by the layer 142 of the third interlayer dielectric layer ILD3.

Note that in the embodiments illustrated in FIG. 7A and FIG. 8A, respective photo absorption layers 150, 140 extend along a portion of the bottom of the trenches T1, T2 to define the apertures A2, A3 associated with respective photoelectric conversion elements 110. The apertures may thus be provided having a size no greater than a light receiving size of the photoelectric conversion element 110 and may be smaller in size to accommodate misalignment during manufacturing. As shown for the aperture A3' in FIG. 8B, the apertures may be longitudinally extending, each of which may be associated with a plurality of photoelectric conversion elements 110 in a row or column of an array of photoelectric conversion elements 110. Note that the cross section illustration of FIG. 8A is taken along the line B, B' shown in FIG. 8B.

Figure 9:
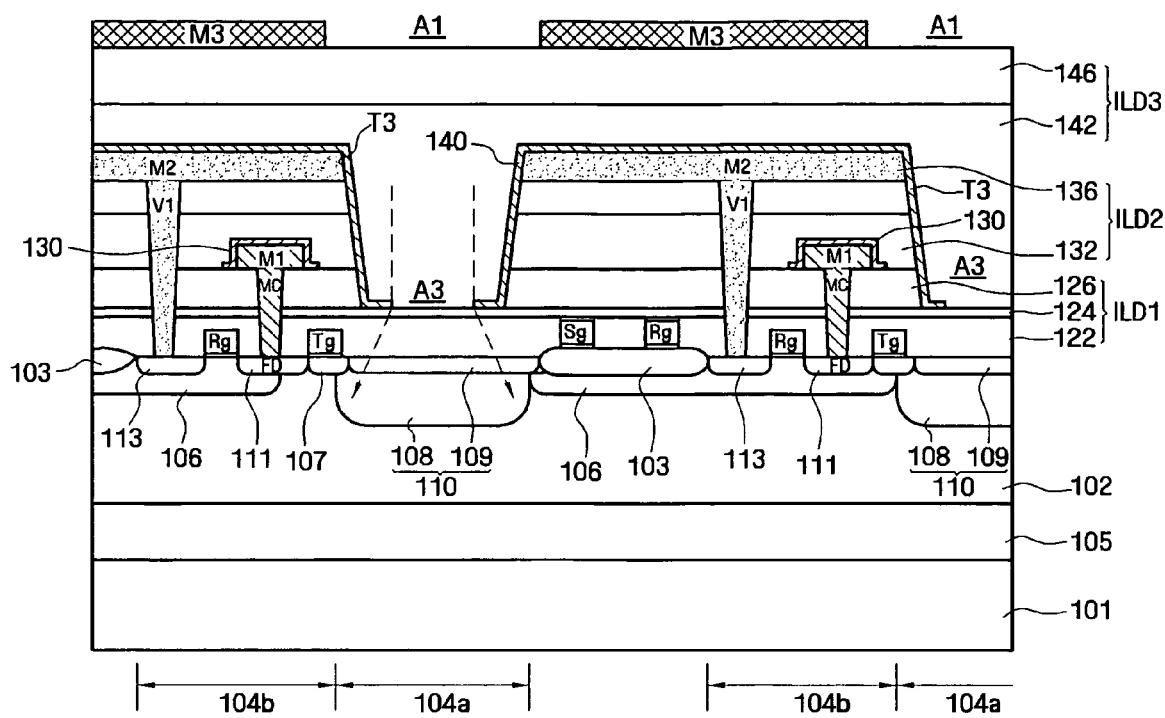
FIG. 9 is a cross-sectional diagram illustrating an image sensor according to some embodiments of the present invention.

Further embodiments of the present invention will now be described with reference to the cross sectional diagram illustration of FIG. 9. The embodiments of FIG. 9 differ from those shown in FIG. 8A in the inclusion of the photo absorption layer 130 on both illustrated portions of the metal layer M1. The embodiments of FIG. 9 further differ in that the trench T3 shown in the embodiments of FIG. 9 differs from the trench T2 in FIG. 8A. In particular, in the embodiments of FIG. 8A, the trench T2 extends through an upper layer 136 of the second interlayer dielectric ILD2 to the etch stop layer 134. In contrast, the trench T3 of the embodiments of FIG. 9 extends through the second interlayer dielectric layer ILD2 and into the first interlayer dielectric layer ILD1. In particular, the trench T3 extends to an etch stop layer 124 included in the first interlayer dielectric layer ILD1. Thus, the bottom of the trench T3 is below the first metal layer M1. As with the embodiments discussed with reference to FIG. 8A, some embodiments of the present invention as shown in FIG. 9 may include only the photo absorption layer 140 without the further inclusion of the photo absorption layer 130 in such arrangements.

Figure 10A:
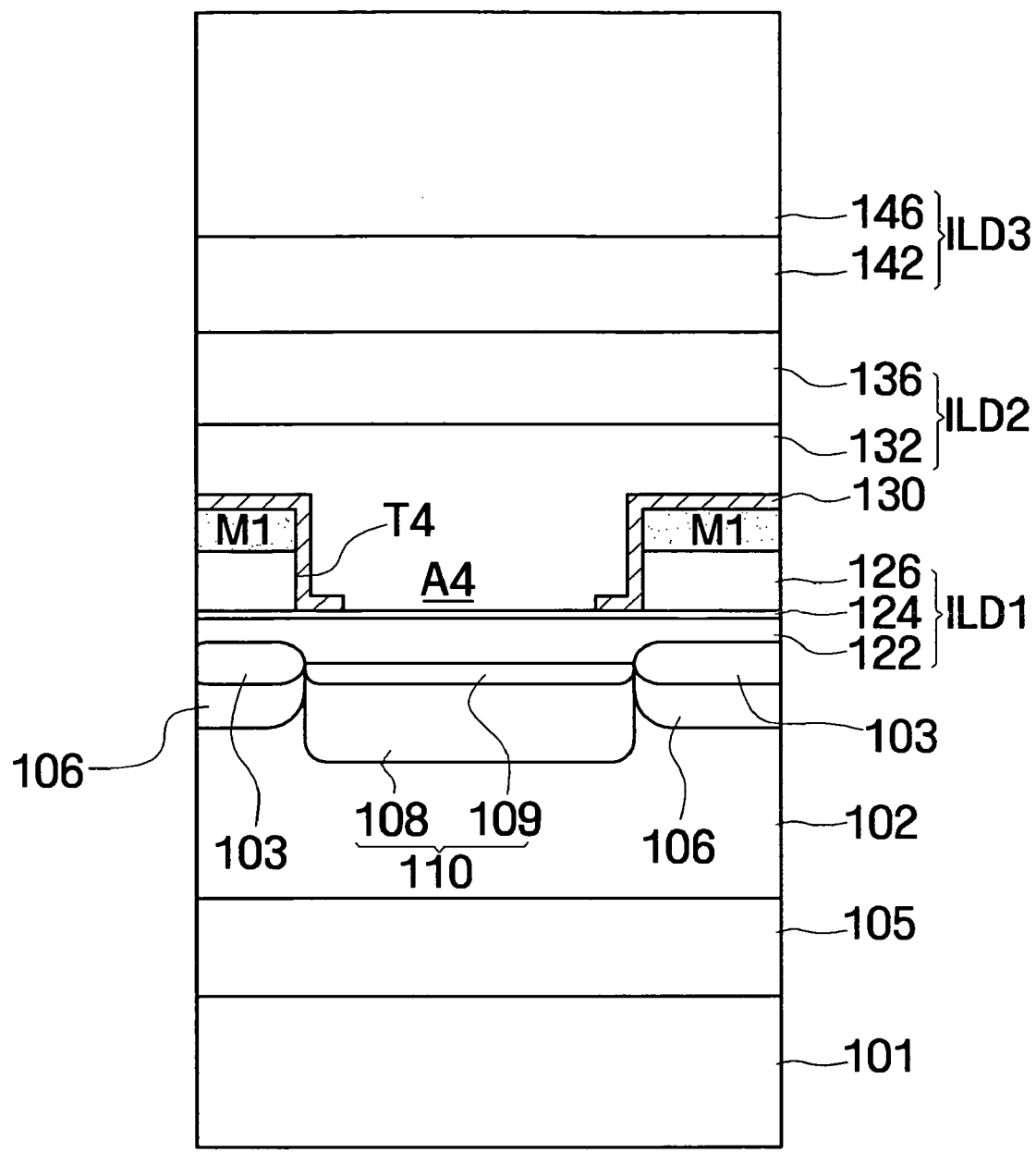
FIG. 10A is a cross-sectional diagram illustrating an image sensor according to some embodiments of the present invention.

Further embodiments of the present invention will now be described with reference to the illustrations of FIGS. 10A and 10B. While only a single photoelectric conversion element 110 is shown in the cross sectional diagram illustration of FIG. 10A, as seen from FIG. 10B, the photoelectric conversion element 110 may be an element of an array of adjacent photoelectric conversion elements. The cross sectional illustration of FIG. 10A is taken along the line BB' in FIG. 10B. For the embodiments of FIG. 10A, the trench T4 extends only to a portion of the first interlayer dielectric layer ILD1 and the photo absorption layer 130 is provided on an upper and side surfaces of the first metal layer M1 and extending along the sidewalls and, in some embodiments, a portion of the bottom of the trench T4. The photo absorption layer 130 extends along the bottom of the trench T4 to define an aperture A4 that may be sized to be small or smaller than the size of the corresponding photoelectric conversion element 110. In particular, for the illustration of FIG. 10A, the first inter layer dielectric layer ILD1 includes an etch stop layer 124 and the trench T4 extends through the upper layer 126 of the first interlayer dielectric layer ILD1 to a depth defined by the etch stop layer 124. However, it will be understood that, in other embodiments of the present invention the etch stop layer 124 is omitted and the depth of the trench T4 is controlled by other known fabrication means. For the embodiments of FIG. 10A, the trench T4 has a relatively lower depth and the distance between the bottom of the trench T4 and the photoelectric conversion element 110 may be reduced or minimized as a result of the reduced aspect radio of the trench T4. The dielectric layer 132 of the second interlayer dielectric layer ILD2 extends into the trench T4 sin the embodiments of FIG. 10A.

Figure 10B:
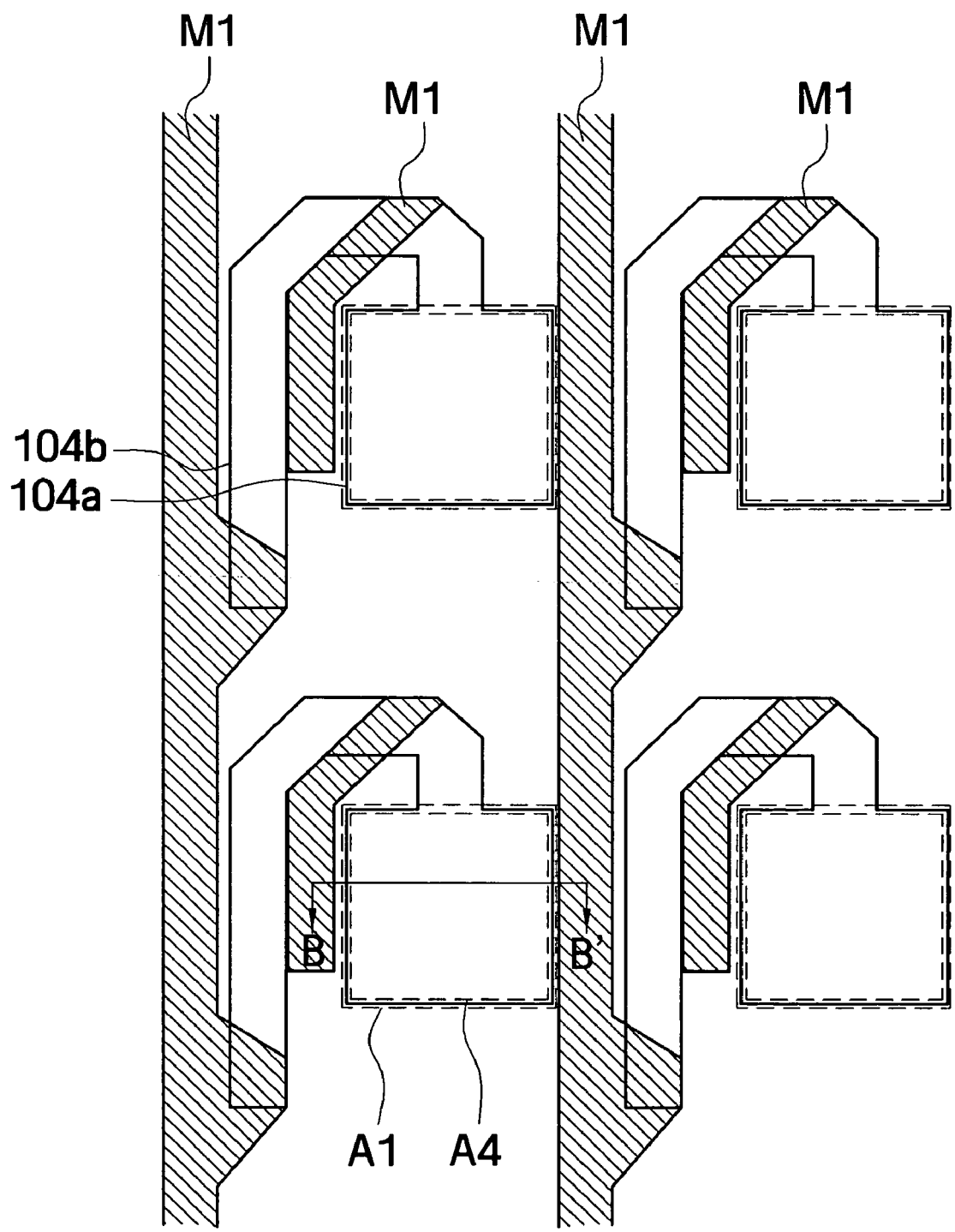
FIG. 10B is a top planar view of the image sensor of FIG. 10A.

As shown in the top planer view of FIG. 10B, the photo absorption layer 130, if deposited only on the metal layer M1, may not fully extend around the entire periphery of the apertures A4. It will be understood that the extension arms of the first metal layer M1 shown adjacent a side of the apertures A4 may, alternatively, be extended to wrap around the bottom portion of the apertures A4 with reference to the orientation shown in FIG. 10B, which may further reduce cross talk between adjacent upper and lower photoelectric conversion elements with respect to the orientation shown in FIG. 10B.

Figure 11A:
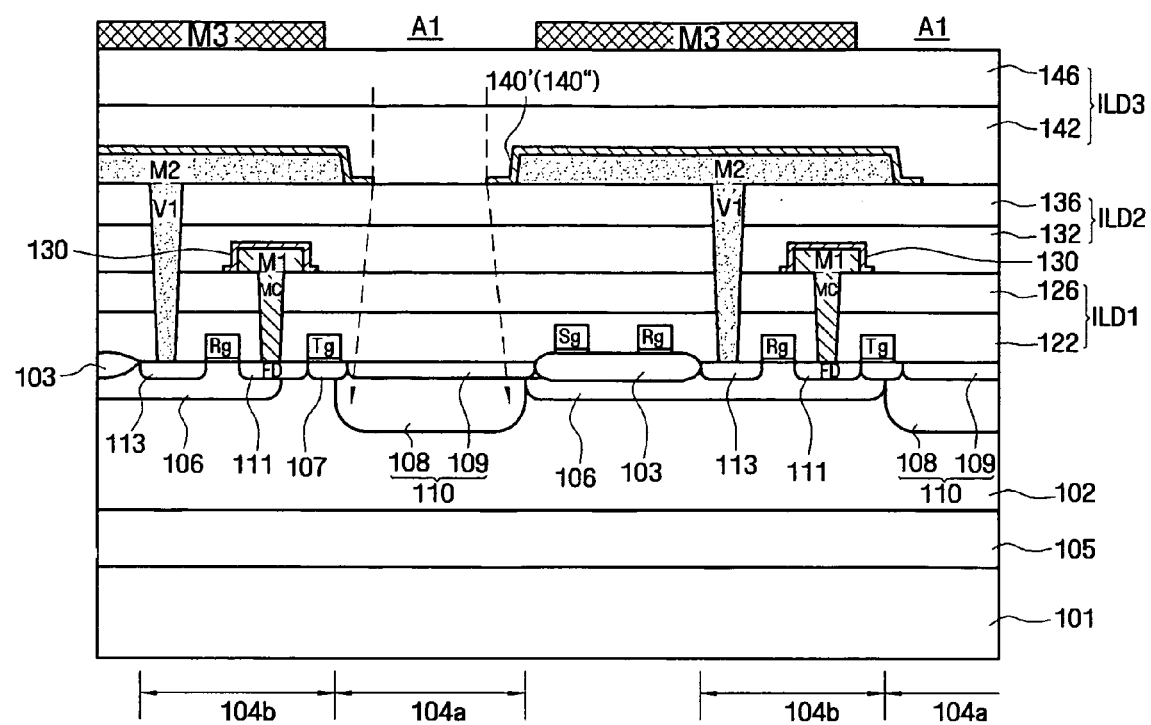
FIG. 11A is a cross-sectional diagram illustrating an image sensor according to some embodiments of the present invention.
Figure 11B:
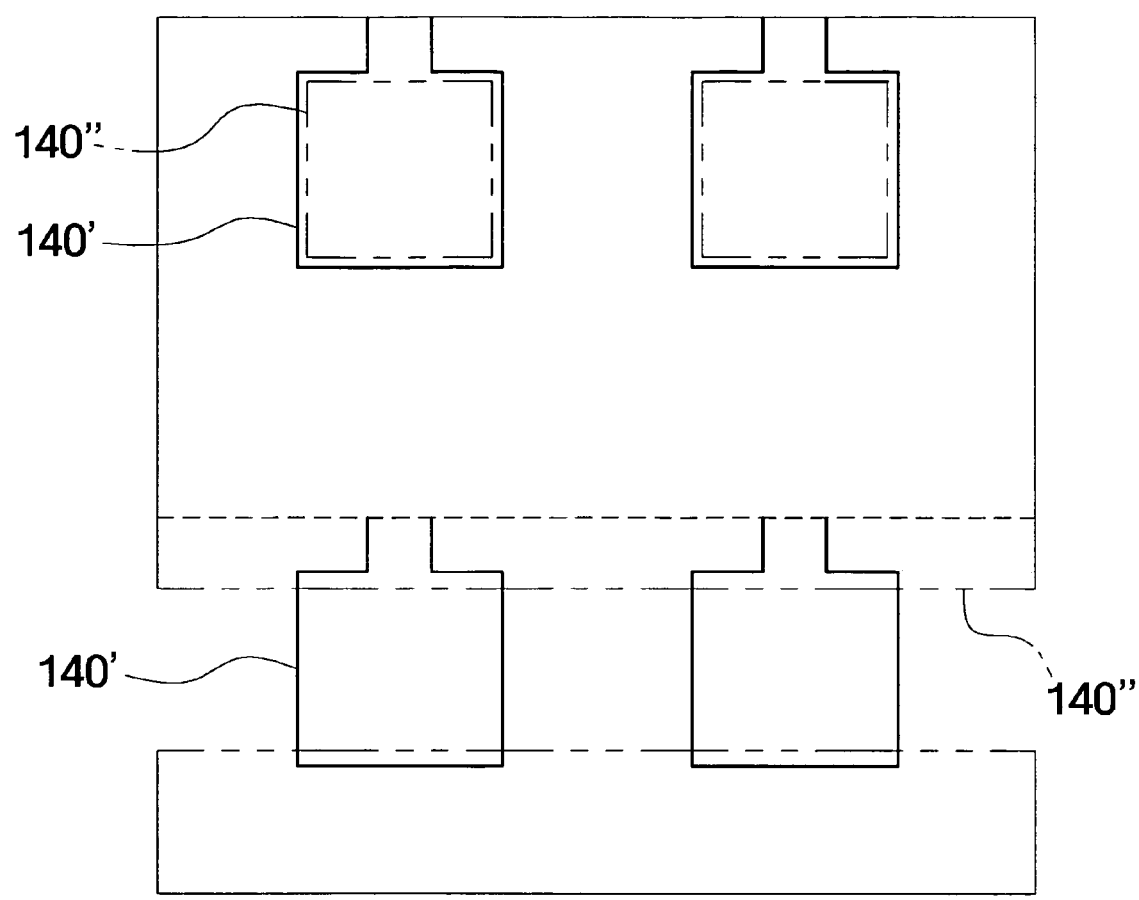
FIG. 11B is a top planar view of the image sensor of FIG. 11A.

Yet further embodiments of the present invention will now be described with reference to FIGS. 11A and 11B. For the embodiments illustrated in FIGS. 11A and 11B, no trench is provided extending through the interlayer dielectric layers ILD1, ILD2, ILD3. Each of the first metal layer M1 and the second metal layer M2 include respective photo absorption layers 130, 140', or 140". The difference between the deposition pattern of the layers 140' and 140" embodiments are illustrated in FIG. 11B where, with respect to the orientation of the drawing in FIG. 11B, the region for the pattern 140' extends to the upper dotted line while for the pattern 140" the deposition extends further down to the dashed patterned line have the notation 140" in FIG. 11B. The portion on the lower end of FIG. 11B may likewise be included in the deposition pattern for the photo absorption layer 140". As shown in the embodiments of FIG. 11A, the photo absorption layer 140', 140" extends from sidewalls of the second metal layer M2 along a surface of the second interlayer dielectric layer ILD2 to define apertures associated with the respective photoelectric conversion elements 110 as indicated by the defracted rays shown in dotted line in FIG. 11A.

Figure 12A:
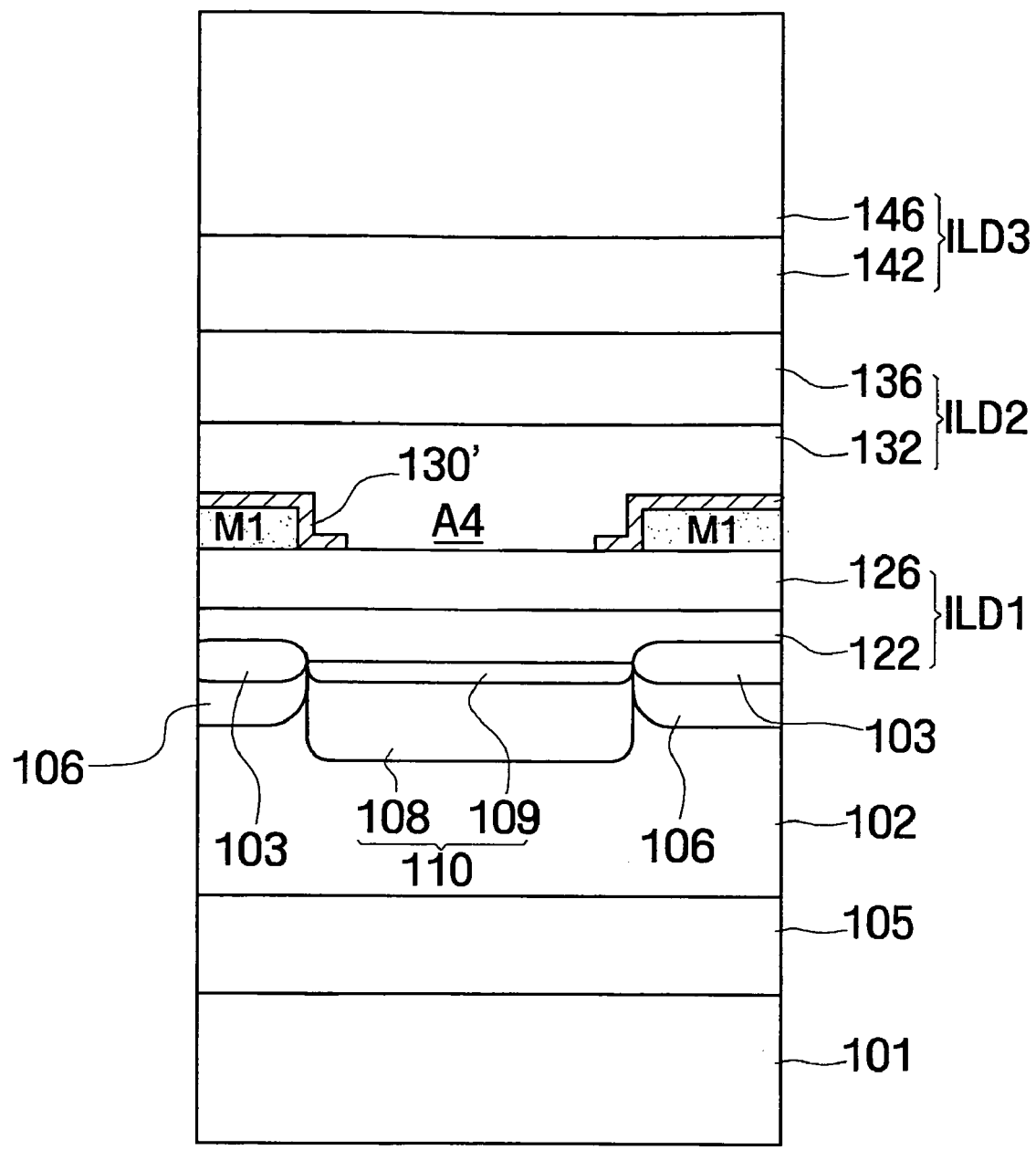
FIG. 12A is a cross-sectional diagram illustrating an image sensor according to some embodiments of the present invention.
Figure 12B:
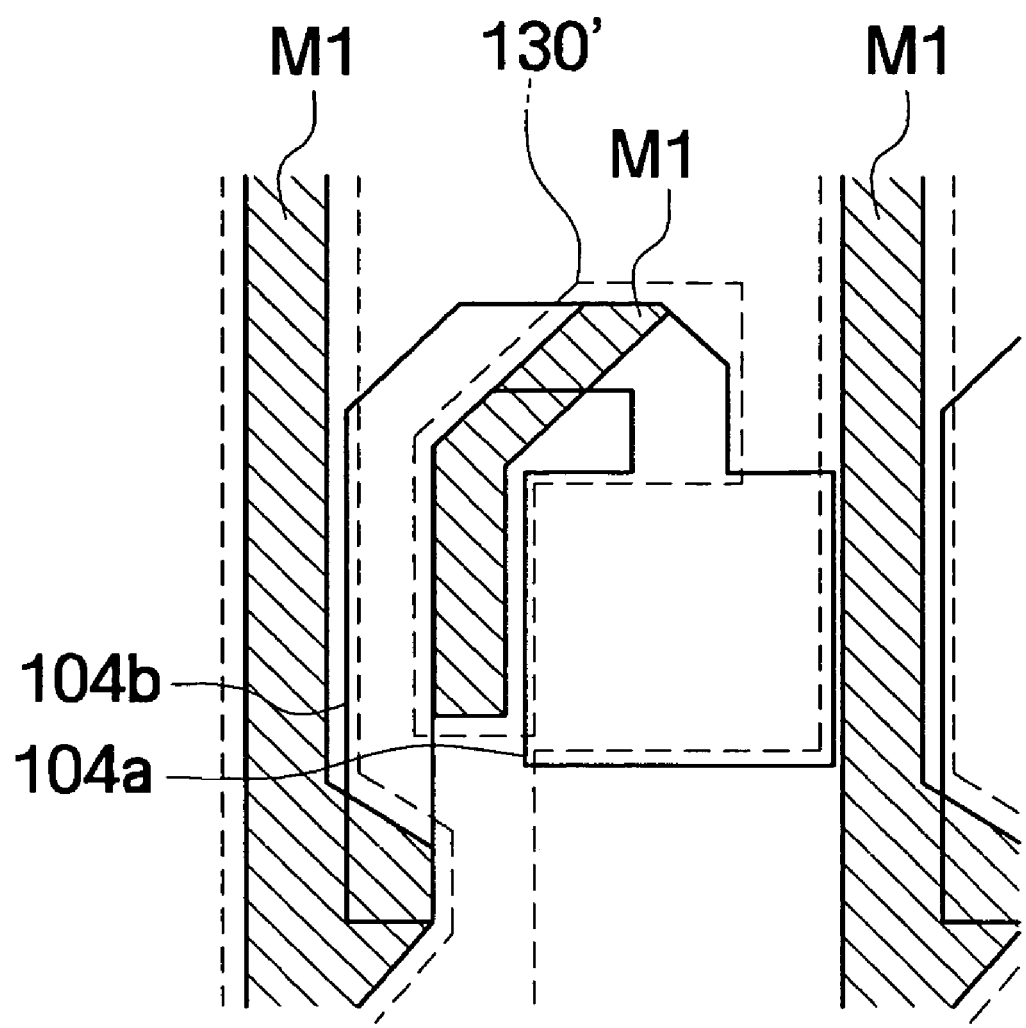
FIG. 12B is a top planar view of the image sensor of FIG. 12A.

Further embodiments of the present invention will now be described with reference to the cross sectional diagram illustration if FIG. 12A and the top planer view of FIG. 12B. As with the embodiments of FIG. 11A, the embodiments of FIG. 12A include no trench through an interlayer dielectric layers ILD1, ILD2, ILD3 but differ in that a photo absorption layer 130' is provided on the first metal layer M1 to define an aperture A4 associated with the photoelectric conversion element 110. In such embodiments, only the first metal layer M1 may have a photo absorption layer 130' included thereon. The photo absorption layer 130' may cover both the upper and side surface of the lower metal layer M1 and, in some embodiments, extend along a surface of the lower interlayer dielectric layer ILD1 to define the aperture A4. As seen in FIG. 12B, the pattern of the lower metal layer M1 may be similar to that illustrated and discussed with reference to FIG. 10B previously. Similarly, the pattern of the metal layer M1 may be extended as described with reference to FIG. 10B to further improve the prevention of reflected rays from the metal layer M1 affecting the signal detected at adjacent photoelectric conversion elements 110.

Figure 12C:
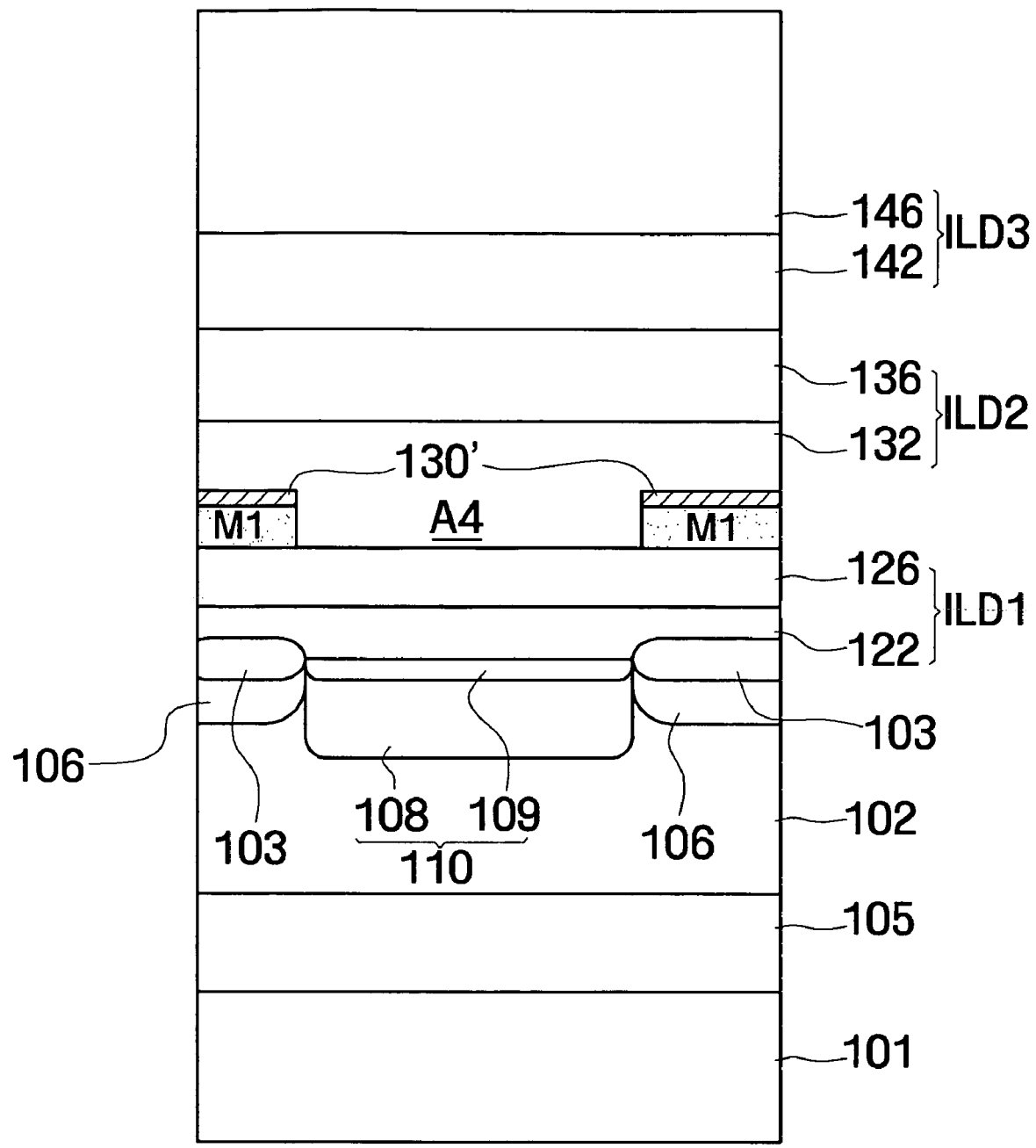
FIG. 12C is a cross-sectional diagram illustrating an alternative arrangement of the image sensor of FIG. 12A according to some embodiments of the present invention.

Referring now to FIG. 12C, further embodiments of the present invention including a variant on that discussed with reference to FIG. 12A will now be described. In particular, the embodiments of FIG. 12C differ from that of FIG. 12A in the extent of the photo absorption layer 130'. In particular, for the embodiments of FIG. 12C, the photo absorption layer 130' covers only an upper surface of the lower metal layer M1 and does not extend along the sidewalls of the metal layer M1 or a portion of the bottom interlayer dielectric layer ILD1. For the embodiments of FIG. 12C, a different fabrication process may be employed utilizing a single mask to form the aperture A4 through both the photo absorption layer 130' and the lower metal layer M1 rather than masking the lower metal layer M1, followed by a separate mask and etch process for the photo absorption layer 130'. Thus, to reduce any incidental light reflection problems from the side surfaces of the lower metal layer M1 defined in the aperture A4, the first metal layer M1 may have a thickness of less than about 1000 angstroms (Å).

Figure 13A:
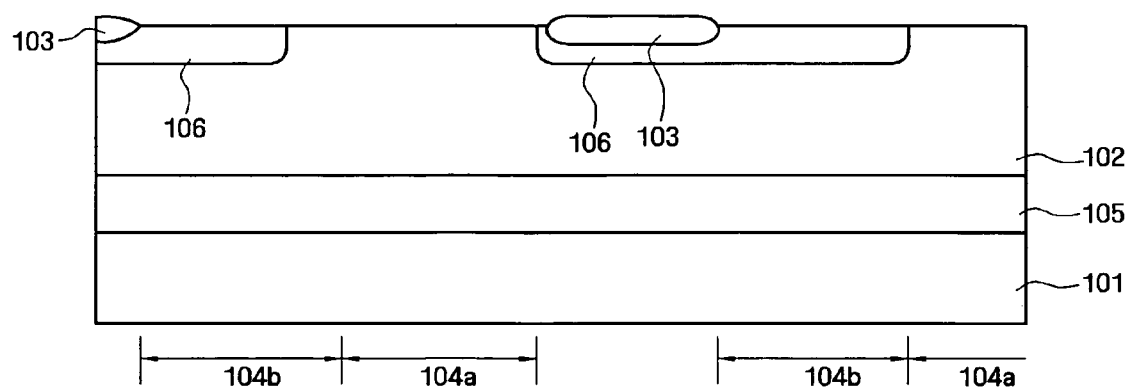
FIGS. 13A to 13E are cross-sectional diagrams illustrating methods for making an image sensor according to some embodiments of the present invention.

Methods of forming an integrated circuit device according to some embodiments of the present invention will now be described with reference to FIGS. 13A through 13E. As shown in FIG. 13A, a substrate 101 is prepared having an epitaxial region 102. An isolation region 103, which may be a shallow trench isolation (ST1) type or local oxidation of silicon (LOCOS) type isolation region is formed and a deep p-well 105 is formed. It will be understood that, while the device features described herein may be fabricated without use of an epitaxial region 102, it is generally desirable to use an epitaxial region in the formation of CIS type devices. The impurity concentration of the deep p-well 105 may be approximately $10^{15}$ to about $10^{19}$ per cubic centimeter ($cm^{-3}$), which may be higher than the concentration of the epitaxial region 102 which may be between about $10^{13}$ and about $10^{17}$ $cm^{-3}$. In some embodiments of the present invention, the thickness of the epitaxial region 102 is between about 2 and about 10 micrometers (μm) which is approximately the same as the absorption length of red or near infrared region light. The p-well 106 may provide for isolation of individual photoelectric conversion elements from neighboring adjacent photoelectric conversion elements in the sensor array.

Figure 13B:
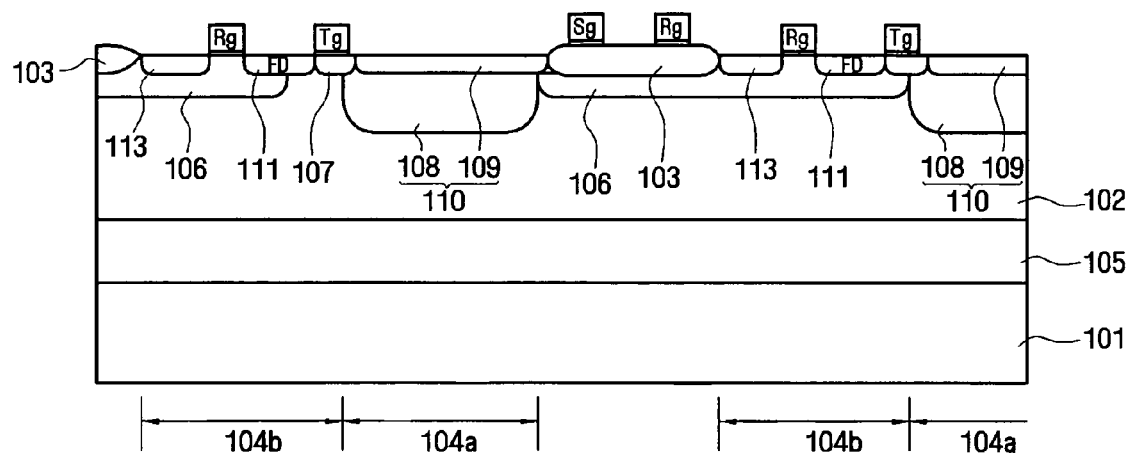

Referring now to the illustration of FIG. 13B, a channel 107 of a transfer resistor is formed in the epitaxial region 102. A transfer gate Tg, reset gate Rg, select gate Sg and driver gate (not shown) are formed. The photoelectric conversion element 110 is formed by forming an n-type region 108 and a p-type HAD region 109. In addition, a floating diffusion region 111 and source/drain region 113 are formed in the epitaxial region 102.

Figure 13C:
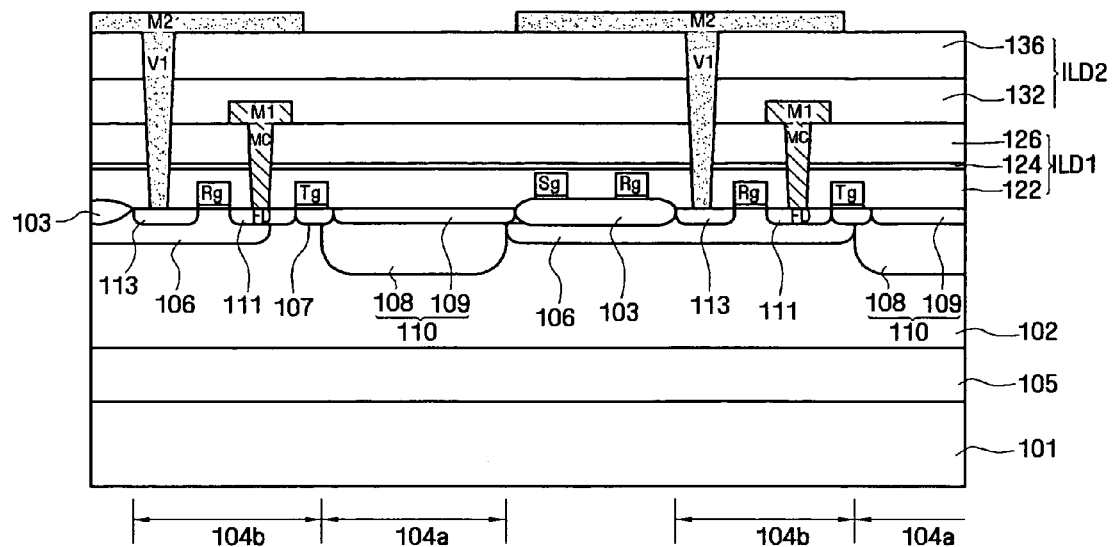

Referring now to FIG. 13C, a first interlayer dielectric layer ILD1 is formed, which may have a thickness between about 7000 Å and 8000 Å. As shown in the particular embodiments illustrated in FIG. 13C, the first interlayer dielectric layer ILD1 includes three layers. The first dielectric layer 122 may be transparent and of a flowable oxide such as undoped silicate glass (USG), polysilica glass (PSG), borosilicate glass (BPSG), and/or hydrogensilsesquioxanes (HSQ). An etch stop layer 124 may be included that may be formed from silicon nitride in some embodiments of the present invention. A second dielectric layer 126 is formed on the etch stop layer 124. The second dielectric layer 126 may be plasma enhanced tetraethyl orthosilicate (PE-TEOS), high density plasma (HDP) and/or plasma silane (P—$SiH_4$). In such embodiments, the second dielectric layer 126 may be a chemical vapor deposition (CVD) type oxide that may, for example, provide better characteristics for chemical mechanical polishing CMP operations used in subsequent processing steps. However, it will be understood that, in other embodiments of the present invention, the lower interlayer dielectric layer ILD1 need not be a multilayer structure.

A first metal contact MC is formed through the lower inner level dielectric layer ILD1 and the first metal layer M1 as formed on an upper surface of the first interlayer dielectric layer ILD1. A second interlayer dielectric layer ILD2 is formed on the first interlayer dielectric layer ILD1. For the illustrated embodiments of FIG. 13C, the second interlayer dielectric layer ILD2 is a multilayer structure including a first dielectric layer 132 and a second dielectric layer 136. As with the first interlayer dielectric layer ILD1, such a multilayer structure for the second interlayer dielectric layer may be utilized if it is desirable to have different characteristic properties, for example, for later processing regions. Also shown in FIG. 13C is formation of a via V1 extending through the first and second interlayer dielectric layers ILD1, ILD2 to the source/drain region 113. A second metal layer M2 is formed on the second interlayer dielectric layer ILD2 and contacting the via V1.

Figure 13D:
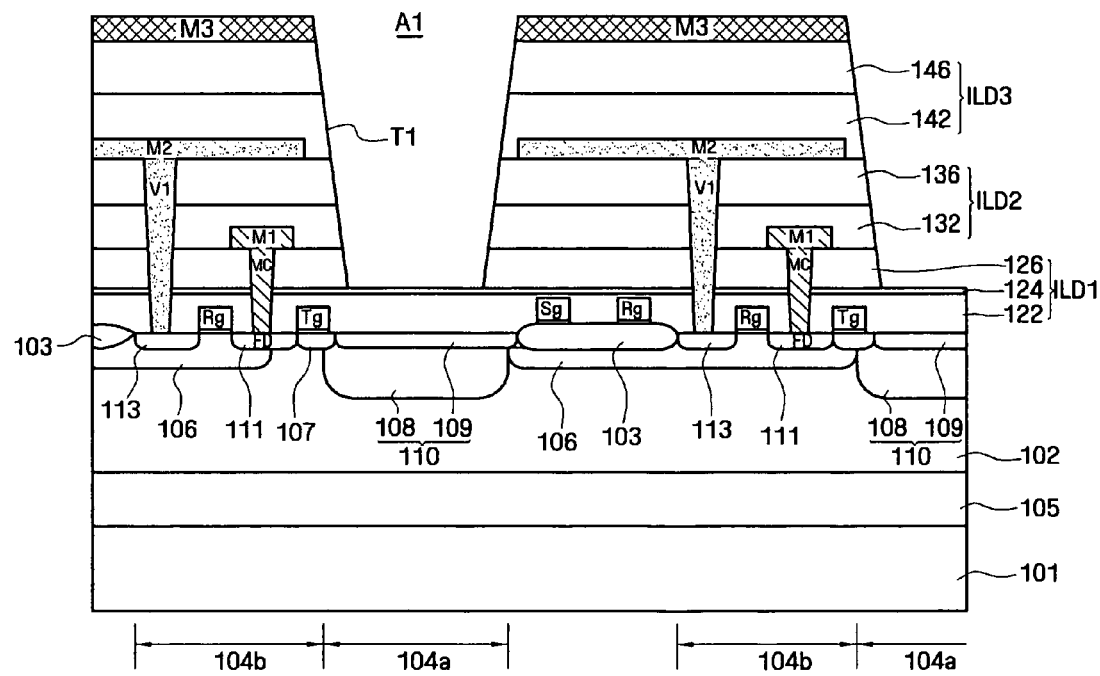

Further operations will now be described with reference to the cross-sectional diagram illustration of FIG. 13D. As shown in FIG. 13D, a third interlayer dielectric layer ILD3 if formed on the second interlayer dielectric layer ILD2 and the second metal layer M2. The third interlayer dielectric layer ILD3 is shown as a multilayered structure including a first dielectric layer 142 and a second dielectric layer 146. A third metal layer M3 is formed on the third interlayer dielectric layer ILD3. A first aperture A1 is formed in the third metal layer M3 and a trench T1 is formed through the second and third interlayer dielectric layers ILD2, ILD3 and a portion of the first interlayer dielectric layer ILD1, the dielectric layer 126, to the etch stop layer 124. The sloped trench T1 may be formed, for example, by dry etching using a CFx, such as $C_4F_6$ and/or $C_3F_8$ as an etching solution.

Figure 13E:
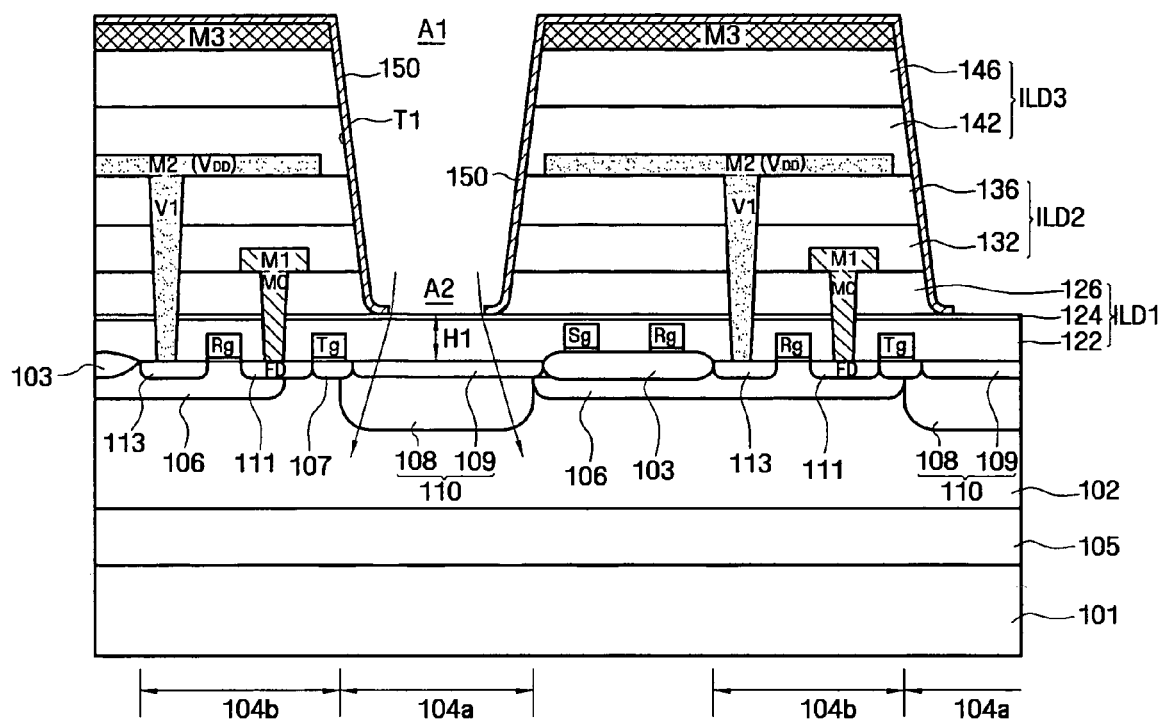

As shown in FIG. 13E, a photo absorption layer 150, such as tungsten, titanium nitride, and/or silicon nitride is formed on a third metal layer M3 and along the walls of the trench T1 and a second aperture A2 is formed in a bottom of the trench T1 through the photo absorption layer 150. Note that the resulting structure, as shown in FIG. 13E, generally corresponds to that discussed with reference to the embodiments described for FIG. 7A. However, it will be understood that similar formation operations, with appropriate adjustments, may be utilized in formation of other embodiments described herein. Similarly, while no further layers above the photo absorption layer 150 are shown in FIG. 13E, it will be understood that additional layers, such as additional interlayer dielectric layers may be formed filling the trench T1 and extending over and covering the metal layer M3.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit device, comprising:
   a semiconductor substrate;
   a sensor array region including a plurality of photoelectric conversion elements arranged in an array on the semiconductor substrate;
   a plurality of interlayer dielectric layers on the sensor array region;
   a plurality of light transmissive regions extending through the plurality of interlayer dielectric layers from respective ones of the plurality of photoelectric conversion elements, each of the light transmissive regions having a trench positioned therein, the trench extending through at least one of the plurality of interlayer dielectric layers;
   a plurality of light reflecting metal elements between ones of the plurality of interlayer dielectric layers positioned outside of and between ones of the light transmissive regions; and
   a photo absorption layer formed on on the plurality of metal elements and extending along sidewalls of the trenches that inhibits reflection of light associated with the photoelectric conversion element of one of the light transmissive regions to another of the light transmissive regions to limit crosstalk between the plurality of photoelectric conversion elements, the photo absorption layer extending along a portion of a bottom of each of the trenches to define apertures associated with the respective photoelectric conversion elements;
   wherein the plurality of interlayer dielectric layers comprises:
   a first interlayer dielectric layer on the sensor array region; and
   a second interlayer dielectric layer on the first interlayer dielectric layer; and
   wherein the plurality of light reflecting metal elements comprises:
   a first metal layer on the first intelayer dielectric layer and having portions extending between ones of the light transmissive regions; and
   a second metal layer on the second interlayer dielectric layer and having portions extending between ones of the light transmissive regions, wherein the photo absorption layer is on and in contact with the second metal layer and extends along sidewalls of the second metal layer.

2. The integrated circuit device of claim 1 wherein the photo absorption layer comprise at least one of tungsten, titanium, tungsten nitride or titanium nitride.

3. The integrated circuit device of claim 1 wherein the device comprises a complementary metal oxide semiconductor (CMOS) image sensor (CIS).

4. The integrated circuit device of claim 1 wherein the trenches are in the second interlayer dielectric layer.

5. The integrated circuit device of claim 4 wherein the second interlayer dielectric layer comprises a lower layer, an etch stop layer on the lower layer and an upper layer on the etch stop layer and wherein the trenches extend through the upper layer to but not through the etch stop layer.

6. The integrated circuit device of claim 4 wherein the trenches extend through the second interlayer dielectric layer and into the first interlayer dielectric layer.

7. The integrated circuit device of claim 6 wherein the first interlayer dielectric layer comprises a lower layer, an etch stop layer on the lower layer and an upper layer on the etch stop layer and wherein the trenches extend through the upper layer to but not through the etch stop layer.

8. The integrated circuit device of claim 4 wherein the trenches have sloped sidewalls.

9. The integrated circuit device of claim 1 wherein the apertures have a size no greater than a light receiving size of the photoelectric conversion elements.

10. The integrated circuit device of claim 1 wherein the apertures comprise longitudinally extending apertures, each of which exposes a plurality of photoelectric conversion elements in a row or column of the array of photoelectric conversion elements.

11. The integrated circuit device of claim 1 wherein the photo absorption layer extends from the sidewalls of the second metal layer along a surface of the second interlayer dielectric layer to at least define the apertures associated with the respective photoelectric conversion elements.

12. The integrated circuit device of claim 3 wherein the trenches extend to the first interlayer dielectric layer.

13. The integrated circuit device of claim 12 wherein the apertures have a size no greater than a light receiving size of the photoelectric conversion elements.

14. The integrated circuit device of claim 12 wherein the first interlayer dielectric layer comprises a lower layer, an etch stop layer on the lower layer and an upper layer on the etch stop layer and wherein the trenches extend through the upper layer to the etch stop layer.

15. The integrated circuit device of claim 12 wherein the trenches have sloped sidewalls.

16. The integrated circuit device of claim 1 further comprising, for each of the photoelectric conversion elements a floating diffusion region in the semiconductor substrate configured to accumulate charge received from the photoelectric conversion element and a conductive contact extending trough the first interlayer dielectric layer from the floating diffusion region to to first metal layer.

17. The integrated circuit device of claim 16 further comprising, for each each of the photoelectric conversion element, a drive transistor configured to amplify a voltage of the floating diffusion region and wherein the first metal layer extends between the contact and to drive transistor.

* * * * *

UNITED STATES PATENT AND TRADEMARK OFFICE
CERTIFICATE OF CORRECTION

PATENT NO. : 7,446,359 B2  
APPLICATION NO. : 11/063025  
DATED : November 4, 2008  
INVENTOR(S) : Lee et al.

Page 1 of 1

It is certified that error appears in the above-identified patent and that said Letters Patent is hereby corrected as shown below:

In the Claims:

Column 15, Claim 1, Line 43:   Please correct "formed on on the"  
                               To read -- formed on the --

Column 16, Claim 11, Line 38:  Please correct "at least define"  
                               To read -- at least partially define --

Column 16, Claim 12, Line 40:  Please correct "claim 3"  
                               To read -- claim 1 --

Column 16, Claim 17, Line 60:  Please correct "for each each of"  
                               To read -- for each of --

Column 16, Claim 17, Line 60-61: Please correct "element"  
                               To read -- elements --

Column 16, Claim 17, Line 63:  Please correct "and to drive"  
                               To read -- and the drive --

Signed and Sealed this

Sixth Day of January, 2009

JON W. DUDAS  
*Director of the United States Patent and Trademark Office*